(12) United States Patent
Suzuki et al.

(10) Patent No.: US 11,562,792 B2
(45) Date of Patent: Jan. 24, 2023

(54) MEMORY SYSTEM HAVING A NON-VOLATILE MEMORY AND A CONTROLLER CONFIGURED TO SWITCH A MODE FOR CONTROLLING AN ACCESS OPERATION TO THE NON-VOLATILE MEMORY

(71) Applicant: KIOXIA CORPORATION, Tokyo (JP)

(72) Inventors: Riki Suzuki, Yokohama Kanagawa (JP); Yoshihisa Kojima, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/184,991

(22) Filed: Feb. 25, 2021

(65) Prior Publication Data
US 2021/0295921 A1    Sep. 23, 2021

(30) Foreign Application Priority Data

Mar. 18, 2020  (JP) .............................. JP2020-047280
Oct. 14, 2020  (JP) .............................. JP2020-173166

(51) Int. Cl.
| | |
|---|---|
| *G11C 16/10* | (2006.01) |
| *G11C 16/26* | (2006.01) |
| *G11C 16/08* | (2006.01) |
| *G11C 29/44* | (2006.01) |
| *G11C 16/22* | (2006.01) |
| *G11C 7/10* | (2006.01) |
| *G11C 29/42* | (2006.01) |
| *G11C 16/30* | (2006.01) |

(52) U.S. Cl.
CPC ............ *G11C 16/10* (2013.01); *G11C 7/1045* (2013.01); *G11C 16/08* (2013.01); *G11C 16/22* (2013.01); *G11C 16/26* (2013.01); *G11C 16/30* (2013.01); *G11C 29/42* (2013.01); *G11C 29/44* (2013.01)

(58) Field of Classification Search
CPC ....... G11C 16/10; G11C 7/1045; G11C 16/08; G11C 16/22; G11C 16/26; G11C 16/30; G11C 29/42; G11C 29/44
See application file for complete search history.

(56) References Cited

U.S. PATENT DOCUMENTS 6,091,640 A * 7/2000 Kawahara .............. G11C 16/10
                                                  365/185.28
6,134,148 A * 10/2000 Kawahara ........... G11C 11/5621
                                                  365/185.28

(Continued)

FOREIGN PATENT DOCUMENTS

JP    2014-021752 A    2/2014
JP    2019-106174 A    6/2019

*Primary Examiner* — Tuan T Nguyen
(74) *Attorney, Agent, or Firm* — Kim & Stewart LLP

(57) ABSTRACT

A memory system includes a non-volatile memory having a plurality of memory cells and a controller. The controller is configured to switch a mode for controlling an access operation to the non-volatile memory from a first mode to a second mode, in response to receiving from a host, a first command for instructing the controller to switch the mode from the first mode to the second mode. The access operation controlled according to the second mode improves data retention relative to the access operation controlled according to the first mode.

20 Claims, 26 Drawing Sheets

(56) References Cited

U.S. PATENT DOCUMENTS

| | | |
|---|---|---|
| 9,152,350 B2 | 10/2015 | Marukame et al. |
| 2019/0034114 A1 | 1/2019 | Natarajan et al. |
| 2019/0129818 A1 | 5/2019 | Kannan et al. |
| 2019/0138226 A1 | 5/2019 | Kanno et al. |
| 2020/0081631 A1* | 3/2020 | Schaefer ............... G06F 3/0673 |

* cited by examiner

FIG. 1A

| MODE | DR | PD | RD |
|---|---|---|---|
| NORMAL MODE | good | good | good |
| LONG-TERM DR GUARANTEE MODE | excellent | poor | poor |

FIG. 1B

| MODE | DR | CELL WEAR-OUT |
|---|---|---|
| NORMAL MODE | good | good |
| LONG-TERM DR GUARANTEE MODE | excellent | poor |

FIG. 1C

| MODE | DR | WRITE PERFORMANCE |
|---|---|---|
| NORMAL MODE | good | good |
| LONG-TERM DR GUARANTEE MODE | excellent | poor |

FIG. 1D

| MODE | DR | USER CAPACITY |
|---|---|---|
| NORMAL MODE | good | good |
| LONG-TERM DR GUARANTEE MODE | excellent | poor |

FIG. 1E

| MODE | DR | ECC CODE RATE |
|---|---|---|
| NORMAL MODE | good | good |
| LONG-TERM DR GUARANTEE MODE | excellent | poor |

FIG. 6

| Block Index | Mode |
|---|---|
| 0 | 0 |
| 1 | 0 |
| 2 | 0 |
| 3 | 1 |
| 4 | 1 |
| 5 | 0 |
| ... | ... |

FIG. 7A

| MODE | NUMBER OF BITS PER MEMORY CELL |
|---|---|
| NORMAL MODE | $B_1$ |
| LONG-TERM DR GUARANTEE MODE | $B_2 (<B_1)$ |

FIG. 7B

| MODE | CODE RATE |
|---|---|
| NORMAL MODE | $R_1$ |
| LONG-TERM DR GUARANTEE MODE | $R_2 (<R_1)$ |

FIG. 7C

| MODE | SIZE OF INCREASE IN WRITE VOLTAGE |
|---|---|
| NORMAL MODE | $\Delta V_1$ |
| LONG-TERM DR GUARANTEE MODE | $\Delta V_2 (<\Delta V_1)$ |

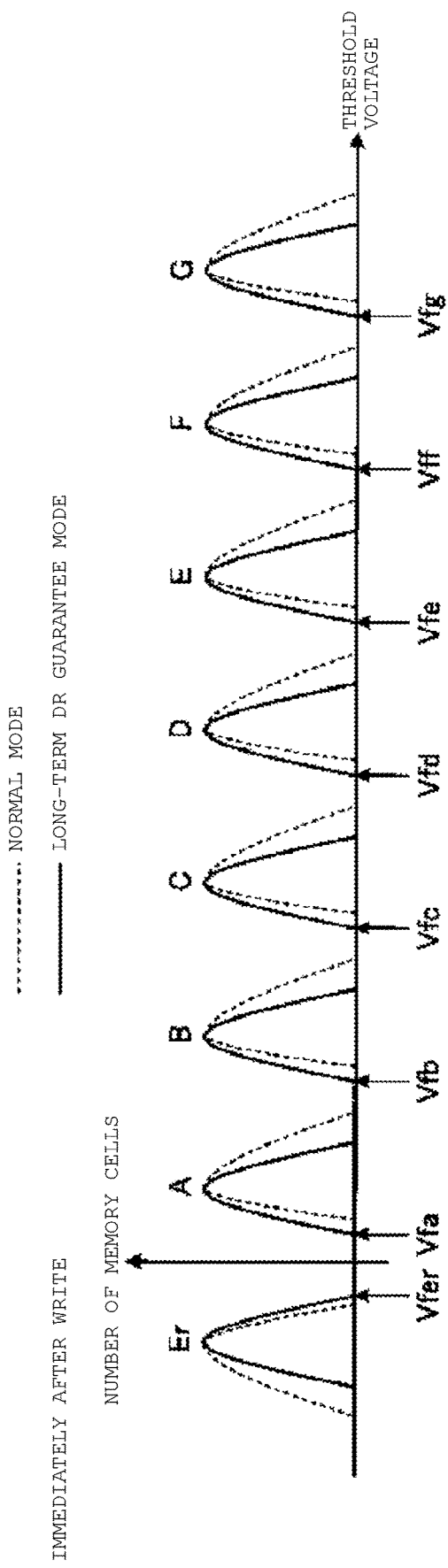
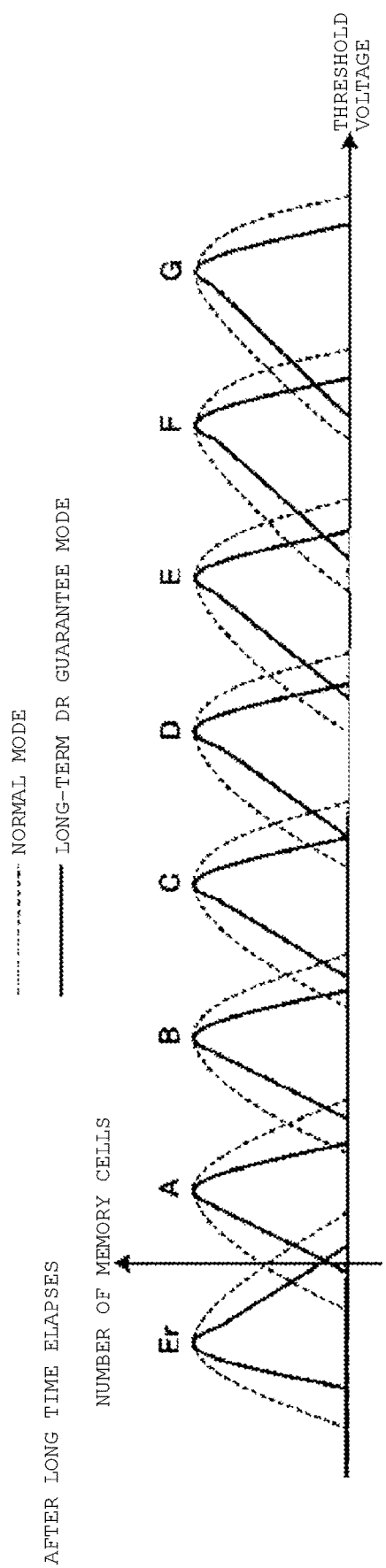

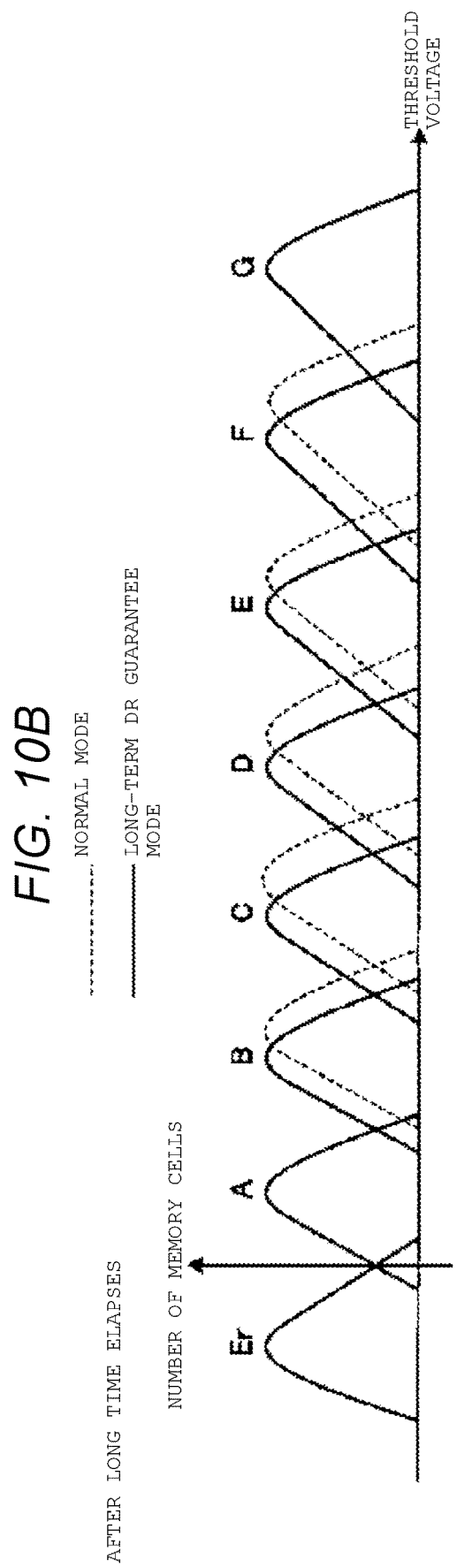

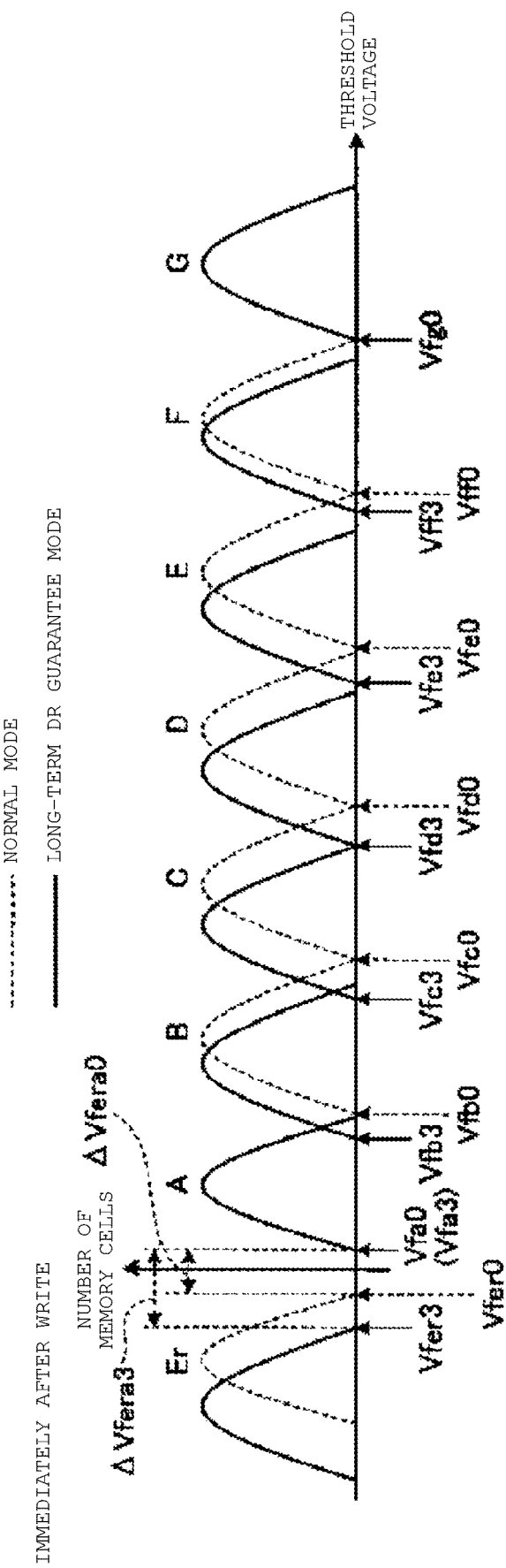

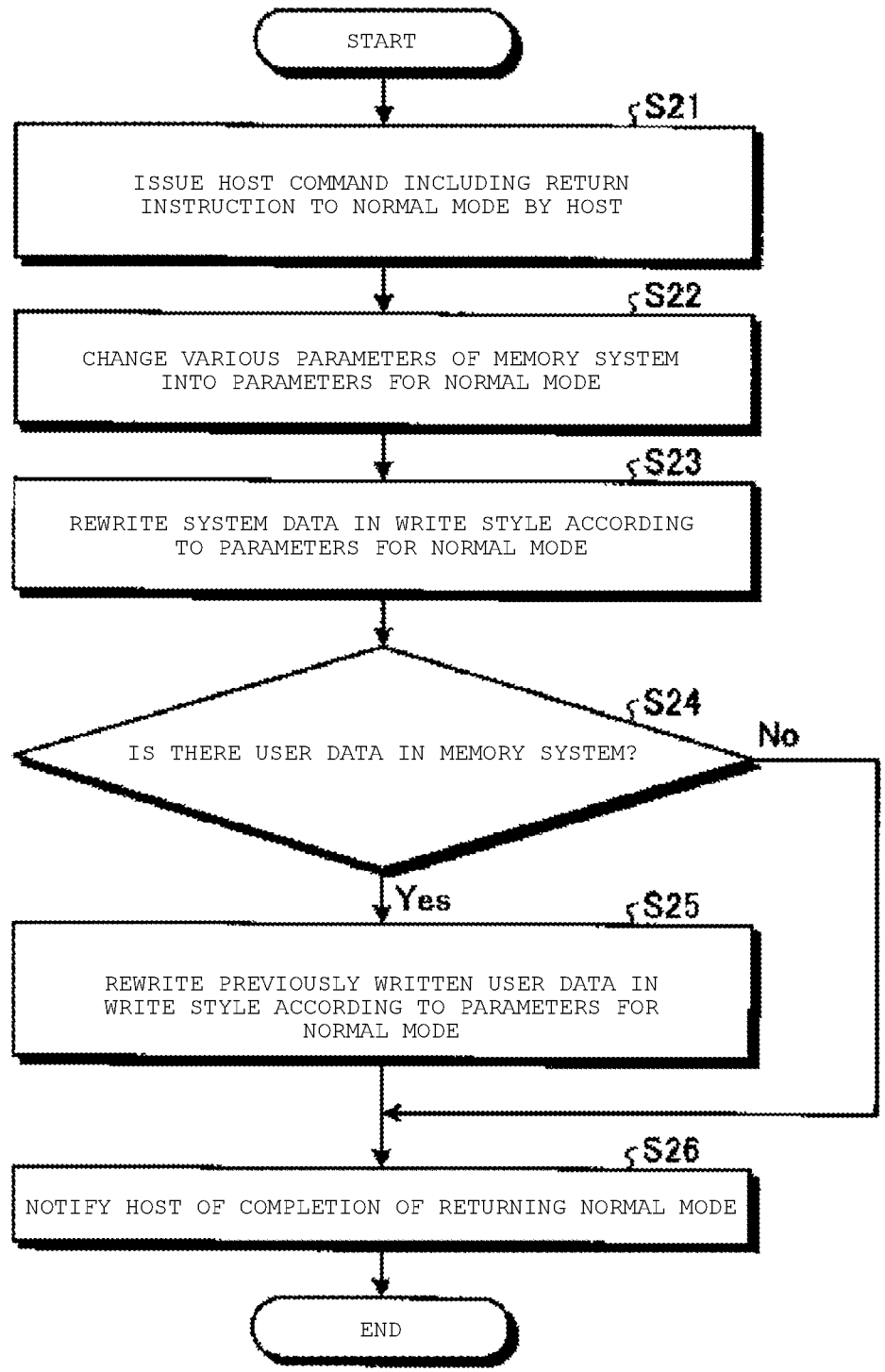

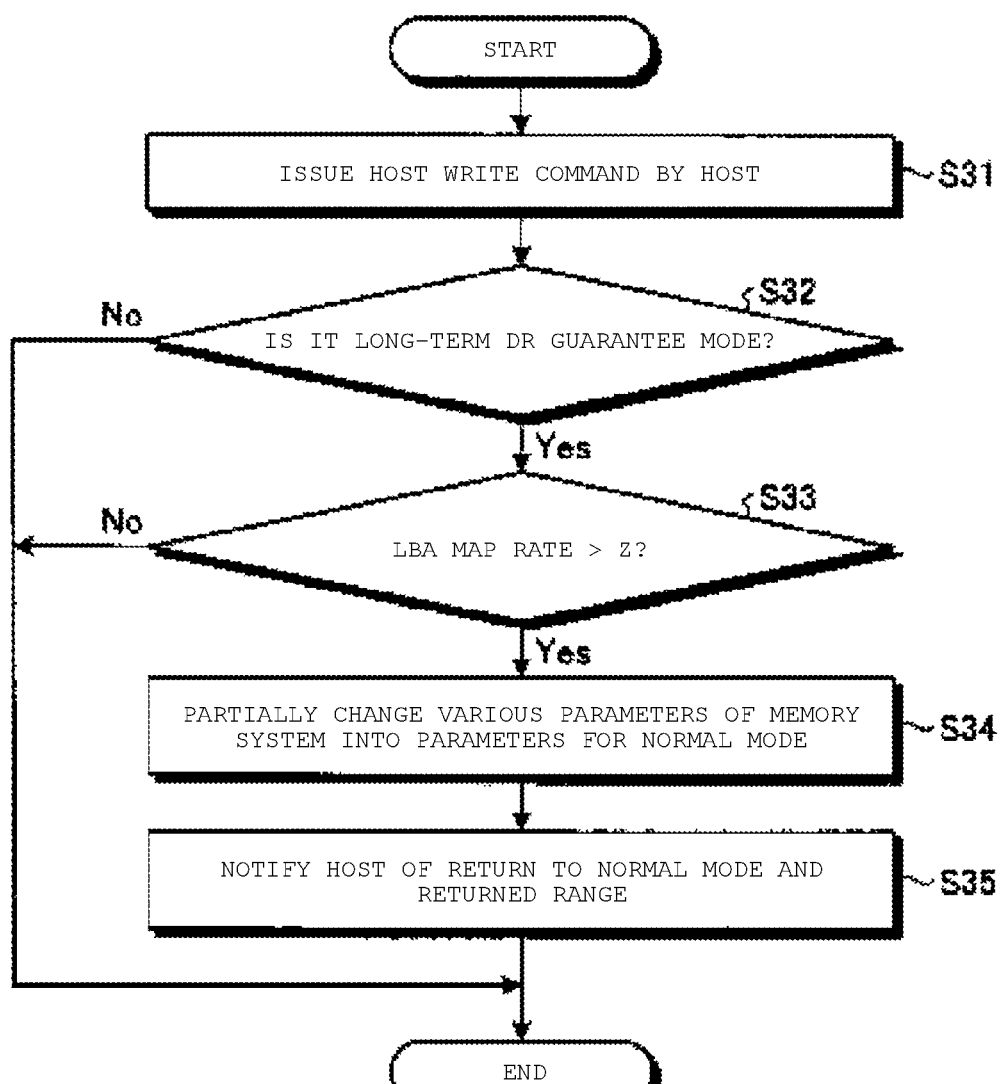

| MODE | DR | CELL WEAR-OUT |
|---|---|---|
| NORMAL MODE | good | good |
| PERFORMANCE PRIORITY MODE | poor | good/poor |

| MODE | DR | WRITE PERFORMANCE |
|---|---|---|
| NORMAL MODE | good | good |
| PERFORMANCE PRIORITY MODE | poor | excellent |

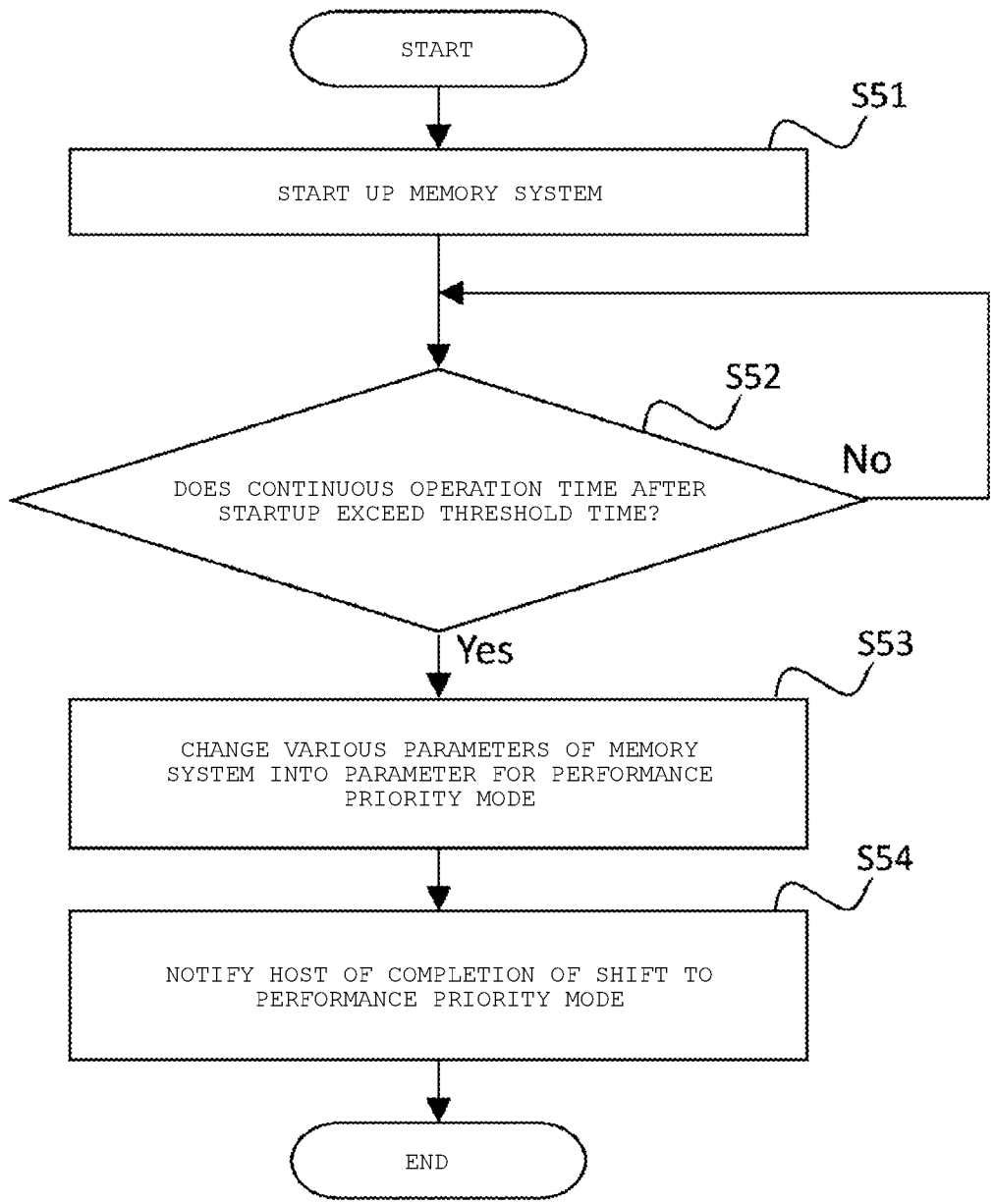

FIG. 20B

| MODE | PROGRAM START VOLTAGE |
|---|---|
| NORMAL MODE | $Vws1$ |
| PERFORMANCE PRIORITY MODE | $Vws3 (>Vws1)$ |

FIG. 20C

| MODE | ERASING START VOLTAGE |
|---|---|
| NORMAL MODE | $Vers1$ |
| PERFORMANCE PRIORITY MODE | $Vers3 (>Vers1)$ |

FIG. 21A

| MODE | VERIFICATION VOLTAGE DURING ERASING PROCESS |
|---|---|
| NORMAL MODE | $Vfer0$ |
| PERFORMANCE PRIORITY MODE | $Vfer4$ |

FIG. 21B

| MODE | NUMBER OF ERROR BITS ALLOWED DURING PROGRAM |
|---|---|
| NORMAL MODE | $n1$ |
| PERFORMANCE PRIORITY MODE | $n3 (>n1)$ |

FIG. 21C

| MODE | NUMBER OF MEMORY CELLS ALLOWED TO BE IN NON-ERASED STATE |
|---|---|
| NORMAL MODE | $m1$ |
| PERFORMANCE PRIORITY MODE | $m3 (>m1)$ |

MEMORY SYSTEM HAVING A NON-VOLATILE MEMORY AND A CONTROLLER CONFIGURED TO SWITCH A MODE FOR CONTROLLING AN ACCESS OPERATION TO THE NON-VOLATILE MEMORY

CROSS-REFERENCE TO RELATED APPLICATION

This application is based upon and claims the benefit of priority from Japanese Patent Application No. 2020-047280 filed Mar. 18, 2020 and Japanese Patent Application No. 2020-173166 filed Oct. 14, 2020, the entire contents of which are incorporated herein by reference.

FIELD

Embodiments described herein relate generally to a memory system.

BACKGROUND

In a non-volatile memory having a plurality of memory cells, a threshold voltage of each of the memory cells may change with time, and this affects data retention in the memory cell. It would be desirable to set the data retention of each memory cell to an appropriate level.

DESCRIPTION OF THE DRAWINGS

FIGS. 1A to 1E are diagrams illustrating characteristics of a normal mode and a long-term DR guarantee mode.

FIG. 6 is a diagram illustrating a data structure of mode management information according to the first embodiment.

FIGS. 7A to 7C are diagrams illustrating parameters to be set in the normal mode and the long-term DR guarantee mode in the embodiments.

FIGS. 9A and 9B are diagrams illustrating examples of a threshold voltage distribution of memory cells that are programmed according to the third and fourth embodiments.

FIGS. 10A and 10B are diagrams illustrating examples of a threshold voltage distribution of memory cells that are programmed according to a fifth embodiment.

FIGS. 13A and 13B are diagrams illustrating examples of a threshold voltage distribution of memory cells that are programmed according to an eighth embodiment.

FIG. 15 is a flowchart illustrating a return operation from a long-term DR guarantee mode to a normal mode in a memory system according to a tenth embodiment.

FIG. 16 is a flowchart illustrating a return operation from a long-term DR guarantee mode to a normal mode in a memory system according to an eleventh embodiment.

FIGS. 17A and 17C are diagrams illustrating characteristics of a normal mode and a performance priority mode.

FIG. 18 is a flowchart illustrating a shift operation from the normal mode to the performance priority mode of a memory system according to a twelfth embodiment.

FIG. 19 is a flowchart illustrating a shift operation from a normal mode to a performance priority mode of a memory system according to a thirteenth embodiment.

FIGS. 20A to 20C are diagrams illustrating parameters to be set in a normal mode and a performance priority mode according to fourteenth, fifteenth, and sixteenth embodiments.

FIGS. 21A to 21C are diagrams illustrating parameters to be set in a normal mode and a performance priority mode according to seventeenth, eighteenth, and nineteenth embodiments.

DETAILED DESCRIPTION

Figure 2:
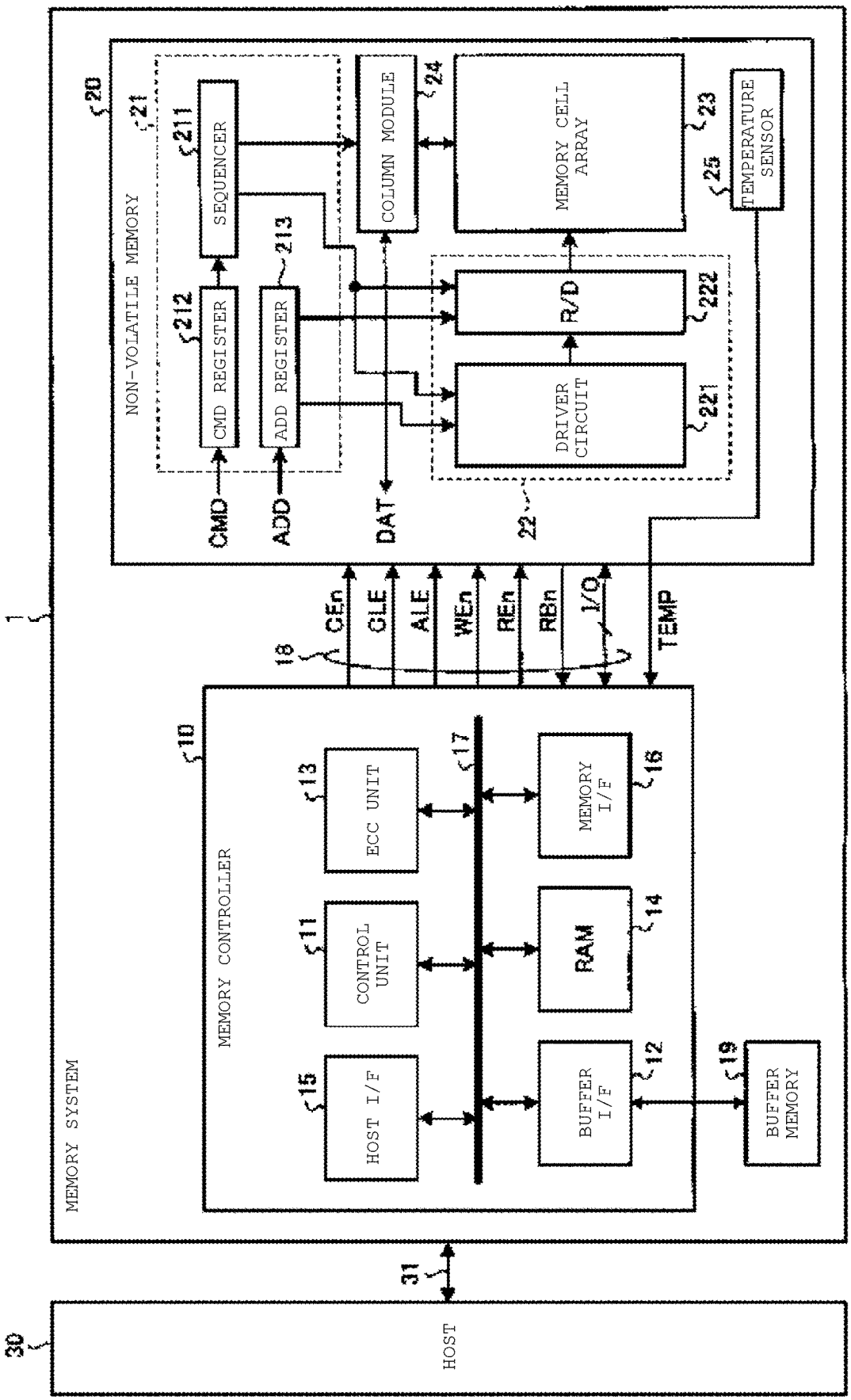
FIG. 2 is a diagram illustrating a configuration of a memory system according to a first embodiment.

Embodiments provide a memory system capable of optimizing data retention in each memory cell.

In general, according to one embodiment, a memory system includes a non-volatile memory having a plurality of memory cells and a controller. The controller is configured to switch a mode for controlling an access operation to the non-volatile memory from a first mode to a second mode, in response to receiving from a host, a first command for instructing the controller to switch the mode from the first mode to the second mode. The access operation controlled according to the second mode improves data retention relative to the access operation controlled according to the first mode.

A memory system according to an embodiment will be described in detail with reference to the accompanying drawings. The scope of the present disclosure is not limited to embodiments disclosed herein.

First Embodiment

A memory system according to the present embodiment includes a non-volatile memory such as a NAND flash memory. The non-volatile memory includes a plurality of memory cells. A threshold voltage of each memory cell may change with time, and this affects the data retention in the memory cell. For this reason, it is desirable to set the data retention (DR) of each memory cell and memory system to an appropriate level.

Here, the DR of a memory cell refers to a state in which data written thereto can be correctly read from the memory cell even though a long time has elapsed since the data was written. An example of a factor for incorrect reading of data from a memory cell over time is the escaping of electrons from the memory cell over time to cause a decrease in a threshold voltage of the memory cell.

DR of a memory system refers to a state in which data written to memory cells thereof can be read correctly from the memory cells even though a long time has elapsed since the data were written, or a state in which data that could not be read correctly from the memory cells can be read correctly by correcting the data using an error correction code (ECC), which will be described below.

A DR period refers to an elapsed time during which DR is maintained. The elapsed time may be real time or may be time based on a value obtained by converting the real time in consideration of a temperature and a degree of wear-out of the memory cell. For example, the higher the temperature, the longer the net elapsed time (elapsed time converted from the real time in consideration of the amount of stress). Further, the greater the degree of wear-out of a memory cell, the longer the net elapsed time.

In the present specification, stress refers to a factor that can worsen data retention characteristics. Particularly, DR stress refers to a factor that worsens DR of a memory cell. The DR stress also includes a factor that worsens DR of a memory system. A DR stress tolerance refers to an acceptable tolerance to the DR stress. A DR error of a memory cell refers to a state in which DR of the memory cell is lost and data cannot be read correctly from the memory cell. A DR error of a memory system refers to a state in which DR of the memory system is lost and data cannot be read correctly even though correction is made using ECC.

A memory system guarantees DR for a first period (for example, 3 months) at a normal ambient temperature (for example, 40° C.), under a life-end condition (that is, a state near the end of lifetime of the memory system). The life-end condition indicates, for example, a state in which an average number of write/erasing processes for each memory cell in the entire memory system is close to an allowable limit number.

However, application usage of a memory system may be limited to a special condition such as a fresh condition with a margin of a life, and thus, even if the memory system is powered off and left as it is for a second period (for example, several years) longer than a first period, it may be required to guarantee that data is not lost (for example, a correction failure probability is $1\times10^{-17}$ or less). This application usage is, for example, usage for a data center.

The fresh condition includes, for example, a state in which an average number of write/erasing processes for each memory cell in the entire memory system is much less than the allowable limit number. Alternatively, the fresh condition includes a state where a logical block address (LBA) map rate, which will be described below, is reduced significantly (for example, 10%).

Therefore, in the first embodiment, a memory system is provided with a long-term DR guarantee mode for guaranteeing DR for a longer period than in the normal mode. The memory system according to the present embodiment is switched to the long-term DR guarantee mode according to a host command to control a non-volatile memory. Thereby, DR can be optimized according to a host request.

Specifically, the memory system guarantees DR for a first period in a normal mode. The memory system guarantees DR for a second period, which is longer than the first period, in the long-term DR guarantee mode. The first period is, for example, 3 months. The second period is, for example, one to several years. In the normal mode, a state in which an average number of write/erasing processes for each memory cell in the entire memory system is large, is assumed, and/or a state in which an LBA map rate is high, is assumed. In the long-term DR guarantee mode, a state in which the average number of write/erasing processes for each memory cell in the entire memory system is small, is assumed, and/or a state where the LBA map rate is low, is assumed.

The LBA map rate refers to a ratio between a user capacity and a capacity corresponding to logical addresses associated with the non-volatile memory in address conversion information. The user capacity indicates a maximum capacity that can store user data in the entire memory system. The user capacity is also referred to as a system user capacity. The LBA map rate is represented by, for example, the following equation.

(LBA map rate)=(number of logical addresses corresponding to the user capacity)/(number of logical addresses associated with non-volatile memory)

One logical address corresponds to a fixed capacity of the non-volatile memory. Further, in the present embodiment, the user capacity can change between the normal mode and the long-term DR guarantee mode as will be described below. The user capacity in the equation refers to the user capacity in the normal mode.

In the normal mode, parameters of write of relatively less wear-out and/or ECC of a high code rate are used. The code rate is calculated by dividing a user data length by a code word length, where the code word length is a sum of the user data length and a parity length. In the long-term DR guarantee mode, parameters of write of relatively great wear-out and/or ECC of a low code rate are used. The parameters of write of great wear-out also have a relatively stress-resistant write condition. In the long-term DR guarantee mode, reducing a user capacity and/or reducing write performance can be performed if necessary.

When shifting from the normal mode to the long-term DR guarantee mode, newly written user data is written in a write style according to parameters for the long-term DR guarantee mode. When shifting from the normal mode to the long-term DR guarantee mode, the previously written user data can be refreshed (that is, rewritten) in a write style according to parameters for the long-term DR guarantee mode.

The user data is received from a host together with designation of a logical address. Further, system data is used by the memory controller 10 to manage the memory system 1. No logical address is designated for the system data. For example, the system data includes address conversion information. The system data is also referred to as management information.

The memory system has various characteristics other than DR, and in the long-term DR guarantee mode, priority is given to ensuring the DR at the expense of other characteristics as compared with the normal mode. That is, as illustrated in FIGS. 1A to 1E, there is a trade-off relationship between respective parameters relating to writing to the non-volatile memory. FIGS. 1A to 1E is a diagram illustrating characteristics of the normal mode and the long-term DR guarantee mode.

As illustrated in FIG. 1A, DR, program disturb (PD), and read disturb (RD), which are parameters relating to reliability of memory cells, have a trade-off relationship between the normal mode and the long-term DR guarantee mode.

The PD is information indicating stress generated during a write process. The PD is stress on a memory cell and memory cells other than the memory cell due to a write process to the memory cell. The PD mainly refers to unintended write to a memory cell other than the memory cell associated with the write process to a certain memory cell. Further, the write process and the erasing process accelerate deterioration of an oxide film of the memory cell, which may deteriorate reliability of the memory cell. Therefore, the PD may be caused by wear-out of the memory cell (oxide film) due to the write process.

The RD is information indicating stress generated during the read process. The RD is a stress on a write-processed memory cell other than the memory cell targeted for the read process, due to the read process to a certain memory cell.

As illustrated in FIG. 1A, in the normal mode, parameters are set to collectively balance tolerance for each stress of DR, PD, and RD, and thus, all the parameters may be relatively good. In the long-term DR guarantee mode, DR stress tolerance is prioritized, and PD stress and RD stress are not, and thus, DR may be very good (excellent), whereas PD and RD may be poor.

As illustrated in FIG. 1B, DR and cell wear-out have a trade-off relationship between the normal mode and the long-term DR guarantee mode. The cell wear-out indicates a degree of wear-out of a memory cell due to one-time write/erasing process to the memory cell. As illustrated in FIG. 1B, in the normal mode, parameters are set to collectively balance tolerance for DR stress and cell wear-out, and thus, all the parameters may be relatively good. In the long-term DR guarantee mode, DR stress tolerance is prioritized and cell wear-out may be increased, and thus, DR may be very good (excellent), whereas cell wear-out characteristics may be poor.

As illustrated in FIG. 1C, DR and write performance have a trade-off relationship between the normal mode and the long-term DR guarantee mode. The write performance means a high speed of a write process and indicates reduction in program time (tPROG). As illustrated in FIG. 1C, in the normal mode, parameters are set to collectively balance tolerance for DR stress and write performance, and thus, all the parameters may be relatively good. In the normal mode, parameters with a short program time are used to increase write performance of each memory cell. In the long-term DR guarantee mode, parameters are used in which DR stress tolerance is prioritized at the expense of write performance, and thus, DR may be very good (excellent), whereas the write performance may be poor.

As illustrated in FIG. 1D, DR and a system user capacity have a trade-off relationship between the normal mode and the long-term DR guarantee mode. As illustrated in FIG. 1D, in the normal mode, parameters are set to collectively balance tolerance for DR stress and a system user capacity, and thus, all the parameters may be relatively good. In the long-term DR guarantee mode, DR stress tolerance is prioritized and the system user capacity may be reduced, and thus, DR may be very good (excellent), whereas the system user capacity may be poor.

As illustrated in FIG. 1E, DR and an ECC code rate have a trade-off relationship between the normal mode and the long-term DR guarantee mode. The ECC code rate represents a ratio of user data to a code word including ECC parity generated in an error correction coding process and the user data. The ECC code rate is represented by, for example, the following equation.

(code rate)=(number of bits of user data)/(number of bits of code word), where (number of bits of code word)= (number of bits of user data)+(number of bits of ECC parity). As the code rate is increased, the number of ECC parity bits for the number of bits of user data is relatively small, and thereby, an error correction capability is reduced. However, the number of ECC parity bits is reduced, and it is good that a storage capacity which may be used by the memory system increases.

As illustrated in FIG. 1E, in the normal mode, parameters are set to collectively balance tolerance for DR stress and an ECC code rate, and thus, all the parameters may be relatively good. In the long-term DR guarantee mode, DR stress tolerance is prioritized, and the number of ECC parity bits for user data may be relatively high, and thus, DR may be very good (excellent) whereas the ECC code rate may be poor.

As described above, since the normal mode is preferable when collectively considering performance of a memory system, the memory system normally operates in the normal mode. Meanwhile, when the memory system receives a command instructing extension of DR from the host, the memory system temporarily operates in the long-term DR guarantee mode, assuming that there is a request from a user. Thereby, DR of each memory cell and DR of the memory system can be optimized according to the request of the user while ensuring normal performance of the memory system.

The memory system 1 is configured as illustrated in FIG. 2. FIG. 2 is a diagram illustrating the configuration of the memory system 1.

The memory system 1 includes a non-volatile memory 20, the memory controller 10, and a buffer memory 19. The memory system 1 can be connected to a host 30. FIG. 2 illustrates a state where the memory system 1 is connected to the host 30. The host 30 may be, for example, an electronic device such as a personal computer, a server device, a mobile terminal, or a digital still camera.

The memory system 1 may be any memory system including the non-volatile memory 20, such as a solid state drive (SSD) or a memory card in which the memory controller 10 and the non-volatile memory 20 are configured as one package.

The non-volatile memory 20 stores data in a non-volatile manner. The non-volatile memory 20 is, for example, a NAND flash memory (hereinafter, referred to simply as a NAND memory). The non-volatile memory 20 may be configured with a plurality of memory chips. In the following description, a case where a NAND memory is used as the non-volatile memory 20 will be illustrated. A three-dimensional structure flash memory, a resistive random access memory (ReRAM), a ferroelectric random access memory (FeRAM), a magnetoresistive random access memory (MRAM), and the like may also be used as the non-volatile memory 20. Further, it is not essential that the non-volatile memory 20 is a semiconductor memory. It is possible to apply the present embodiment to various storage media other than the semiconductor memory.

The memory controller 10 is a semiconductor integrated circuit configured as, for example, a system-on-a-chip (SoC). Part or all of functions of each element of the memory controller 10 which will be described below may be implemented in a central processing unit (CPU) that executes firmware or may be implemented in dedicated hardware.

The memory controller 10 is connected to the host 30 by a host bus 31. The memory controller 10 controls a write process to the non-volatile memory 20 according to a host write command from the host 30. Further, the memory controller 10 controls a read process from the non-volatile memory 20 according to a host read command from the host 30. Any standard, such as serial advanced technology attachment (SATA), serial attached SCSI (SAS), or the Peripheral Component Interconnect express (PCIe)®, may be adopted as a standard with which the host bus 31 is compliant.

The memory controller 10 is connected to the non-volatile memory 20 by a memory bus 18. The memory bus 18 is used for transmitting and receiving signals between the memory controller 10 and the non-volatile memory 20. Specific examples of this signal include a chip enable signal CEn, a command latch enable signal CLE, an address latch enable signal ALE, a write enable signal WEn, a read enable signal REn, a ready-busy signal RBn, and an input/output signal I/O.

The signal CEn enables a memory chip in the non-volatile memory 20. The signal CLE notifies the non-volatile memory 20 that the input signal I/O to the non-volatile memory 20 is a command. The signal ALE notifies the non-volatile memory 20 that the input signal I/O to the non-volatile memory 20 is an address. The signal WEn notifies the non-volatile memory 20 that the input signal I/O is being input into the non-volatile memory 20. The signal REn notifies the non-volatile memory 20 that the output signal I/O should be output from the non-volatile memory 20. The ready-busy signal RBn indicates whether the non-volatile memory 20 is in a ready state (a state where a command from the memory controller 10 can be received) or a busy state (a state where a command from the memory controller 10 cannot be received). The input/output signal I/O has, for example, 8 bits. The input/output signal I/O contains data transmitted and received between the non-volatile memory 20 and the memory controller 10. The input/output signal I/O includes a command, an address, write data (data to be written), read data (data which is read), and a status.

A signal TEMP indicating a temperature of the non-volatile memory 20 detected by a temperature sensor 25 is also input from the non-volatile memory 20 to the memory controller 10. As illustrated in FIG. 2, the temperature sensor 25 may be provided inside the non-volatile memory 20. Alternatively, the temperature sensor 25 may be provided outside the non-volatile memory 20. A signal line for transmitting the signal TEMP output from the temperature sensor 25 may be provided in the memory bus 18 or may be an independent signal line separate from the memory bus 18.

The memory controller 10 includes a host interface (host I/F) 15, a control unit 11, a buffer interface (buffer I/F) 12, a random access memory (RAM) 14, a memory interface (memory I/F) 16, and an ECC unit 13. The host I/F 15, the control unit 11, the buffer I/F 12, the RAM 14, the memory I/F 16, and the ECC unit 13 are connected to each other by the internal bus 17.

The host I/F 15 is connected to the host 30 via the host bus 31. The host I/F 15 transfers commands and data received from the host 30 to the control unit 11, the RAM 14, or the buffer memory 19, respectively. Further, the host I/F 15 transfers the data in the RAM 14 or the buffer memory 19 to the host 30 in response to a request from the control unit 11.

The control unit 11 is configured with, for example, a central processing unit (CPU). The control unit 11 controls the operation of each unit of the memory controller 10. For example, when receiving a host write command from the host 30, the control unit 11 issues a write command to the memory I/F 16 to instruct the memory I/F 16 to perform a write process of data to the non-volatile memory 20. When receiving a host read command from the host 30, the control unit 11 issues a read command to the memory I/F 16 to instruct the memory I/F 16 to perform a read process of data from the non-volatile memory 20. Meanwhile, in a case of erasing (erase), for example, the control unit 11 issues an erasing command to the memory I/F 16 as a part of garbage collection or compaction process. In addition to garbage collection, the control unit 11 controls various processes for managing the non-volatile memory 20, such as wear leveling, refreshing, and patrol read execution.

When receiving the host write command from the host 30, the control unit 11 determines a storage area in the non-volatile memory 20 for user data stored in the RAM 14 or the buffer memory 19. A correspondence between a logical address of the user data and a physical address indicating the storage area in the non-volatile memory 20 in which the user data is stored is managed by address conversion information LUT. The address conversion information LUT is also referred to as a look up table. The address conversion information LUT is stored in, for example, the non-volatile memory 20 and read as necessary to be cached in the RAM 14, the buffer memory 19, and/or the like. The address conversion information LUT can be updated in response to a command from the host 30 (for example, a write command, a trim command, a format command), or an internal operation (for example, a garbage collection operation or a refresh operation).

When receiving the host read command from the host 30, the control unit 11 converts a logical address designated by the host read command into a physical address by using the above-described address conversion information LUT, and instructs the memory I/F 16 to perform reading from the physical address.

The memory I/F 16 is connected to the non-volatile memory 20 via the memory bus 18. The memory I/F 16 controls the communication with the non-volatile memory 20. The memory I/F 16 outputs the signal ALE, the signal CLE, the signal WEn, and the signal REn to the non-volatile memory 20 based on a command received from the control unit 11. When performing a write process, the memory I/F 16 transfers a write command issued by the control unit 11 and write data in the RAM 14 or the buffer memory 19 to the non-volatile memory 20 as input/output signals I/O. When performing a read process, the memory I/F 16 transfers a read command issued by the control unit 11 to the non-volatile memory 20 as the input/output signals I/O. Further, the memory I/F 16 receives data read from the non-volatile memory 20 as the input/output signals I/O. The memory I/F 16 transfers the received data to the RAM 14 or the buffer memory 19.

The buffer memory 19 temporarily stores write data or read data. The buffer memory 19 has a larger memory capacity than the RAM 14. The buffer memory 19 may be configured with a dynamic random access memory (DRAM), a static random access memory (SRAM), or the like.

The buffer I/F 12 is a controller that controls an access from the memory controller 10 to the buffer memory 19. The buffer I/F 12 enables an access to the buffer memory 19 at, for example, a double data rate (DDR).

The RAM 14 stores a master table such as address conversion information LUT and various management tables read from a specific area of the non-volatile memory 20 when the memory system 1 starts up. Further, the RAM 14 may be used as a working memory for temporarily storing snapshots of various management tables and/or log information which specifies change difference of the various management tables. The RAM 14 may also be used as a cache memory when transferring data between the host 30 and the non-volatile memory 20. The RAM 14 may be configured with a dynamic random access memory (DRAM), a static random access memory (SRAM), or the like.

The ECC unit 13 encodes and decodes data to perform error detection and error correction for read data. Specifically, the ECC unit 13 encodes data to be written to the non-volatile memory 20 to generate a code word. Further, the ECC unit 13 decodes data (that is, a code word) read from the non-volatile memory 20. The ECC unit 13 performs error detection and error correction on the read data by decoding. When the error correction fails, the ECC unit 13 notifies the control unit 11 of the failure of the error correction. A random algorithm using a Reed-Solomon (RS) code, a Bose-Chaudhuri-Hocquenghem (BCH) code, a low density parity check (LDPC) code, and the like are applicable to an algorithm of encoding and decoding by ECC unit 13.

When performing a write process, the ECC unit 13 receives user data to be written to the non-volatile memory 20 based on a write command under the control of the control unit 11. The ECC unit 13 generates an ECC parity at a code rate controlled by the control unit 11 based on the user data. The ECC unit 13 attaches the ECC parity to the user data to obtain write data (that is, a code word). The code word is written to the non-volatile memory 20.

When performing a read process, the ECC unit 13 receives read data (that is, a code word) read from the non-volatile memory 20 based on a read command under the control of the control unit 11. The ECC unit 13 extracts the ECC parity from the read data. The ECC unit 13 generates a syndrome based on the ECC parity. The ECC unit 13 determines presence or absence of an error bit in the read data based on the syndrome. When the read data includes an error bit, the ECC unit 13 specifies a position of the error bit. The number of error bits that can be corrected by the ECC unit 13 is determined by an error correction capability of a code word (for example, the number of ECC parity bits). When the read data includes the number of error bits less than or equal to the number of correctable error bits, the ECC unit 13 corrects the error bits and notifies the control unit 11 that the correction is successful. When the read data includes more error bits than the correctable error bits, the ECC unit 13 notifies the control unit 11 that the correction fails (uncorrectable). In this case, data may be lost.

The non-volatile memory 20 includes a command process unit 21, a drive unit 22, a memory cell array 23, a column module 24, and a temperature sensor 25. The command process unit 21 includes a sequencer 211, a command register (CMD register) 212, and an address register (ADD register) 213. The drive unit 22 includes a driver circuit 221 and a row decoder (R/D) 222.

The memory cell array 23 includes a plurality of memory cells (a plurality of memory cell transistors MT). Each memory cell is associated with a row and a column. The memory cell array 23 stores data given by the memory controller 10.

The row decoder 222 selects a block to be accessed, and further selects a row in the selected block.

The driver circuit 221 supplies a voltage to the selected block via the row decoder 222.

The column module 24 includes, for example, a sense amplifier and a data latch including a plurality of latch circuits. In a write operation, the column module 24 transfers data DAT received from the memory controller 10 to the memory cell array 23. Further, in a read operation, the column module 24 senses data read from the memory cell array 23 and performs arithmetic operations as necessary. Then, the column module 24 outputs the obtained data DAT to the memory controller 10.

The address register 213 stores an address ADD received from the memory controller 10. The command register 212 stores a command CMD received from the memory controller 10.

The sequencer 211 controls the overall operation of the non-volatile memory 20 based on the command CMD stored in the command register 212.

The temperature sensor 25 detects a temperature around the memory cell array 23 on a regular basis or as needed. The detected temperature may be used to compensate for an operation temperature of the non-volatile memory 20. The detected temperature may be output to the memory controller 10 as a signal TEMP.

Figure 3:
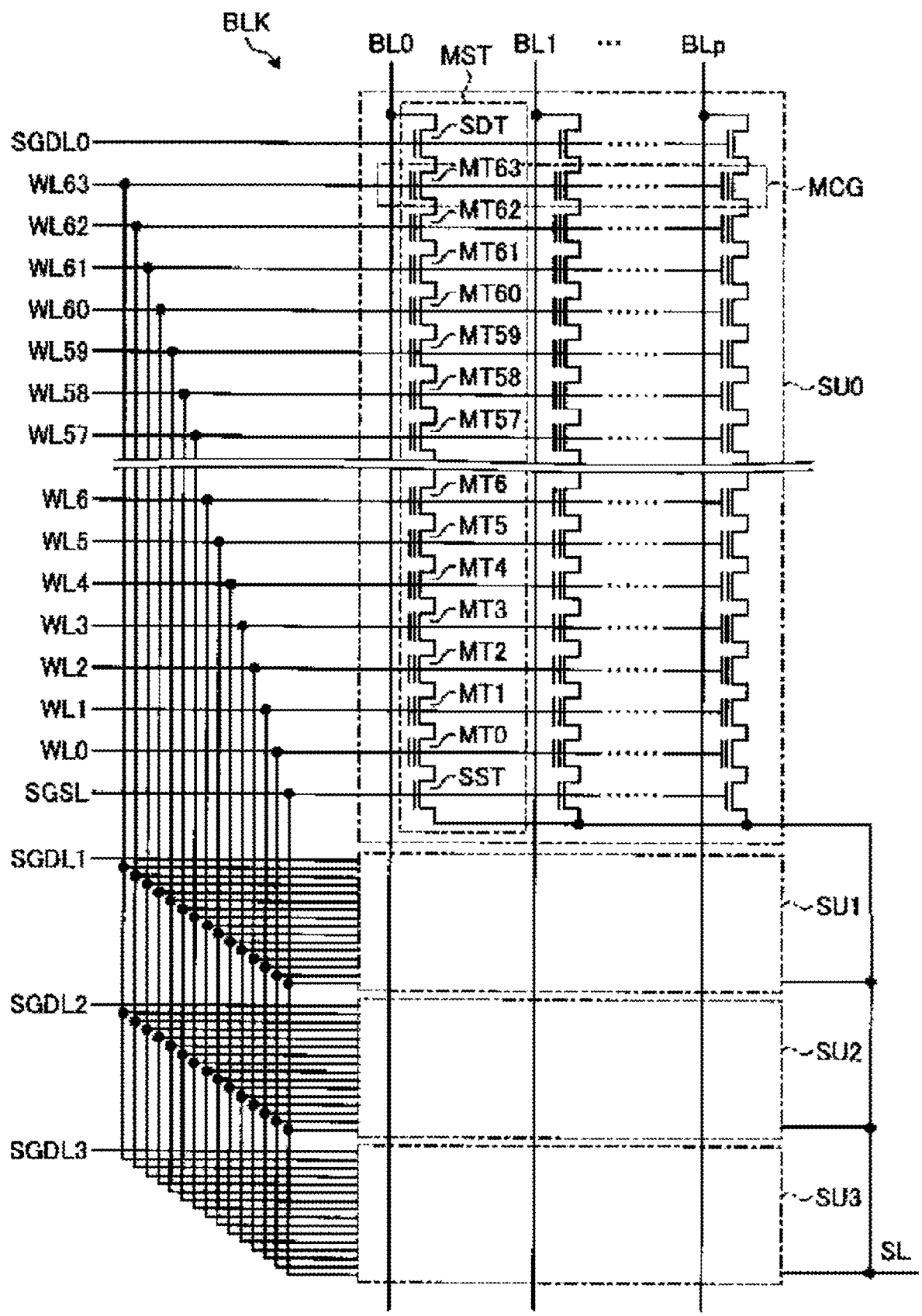
FIG. 3 is a diagram illustrating a configuration of a memory cell array according to the first embodiment.

The non-volatile memory 20 may include a plurality of memory chips. Each memory chip includes a memory cell array. The memory cell array includes a plurality of physical blocks. Each physical block is configured, for example, as illustrated in FIG. 3.

Each physical block BLK includes a plurality of string units SU0 to SU3. The plurality of string units SU0 to SU3 correspond to a plurality of select gate lines SGDL0 to SGDL3. The plurality of string units SU0 to SU3 share a select gate line SGSL. Each of the string units SU0 to SU3 functions as a drive unit in a physical block BLK. Each of the string units SU0 to SU3 can be driven by the select gate lines SGDL0 to SGDL3 corresponding thereto and the select gate line SGSL. Each of the string units SU0 to SU3 includes a plurality of memory strings MST.

Each of the memory strings MST includes, for example, 64 memory cell transistors MT (MT0 to MT63) and select transistors SDT and SST. Each of the memory cell transistors MT has a control gate and a charge storage film, and stores data in a non-volatile manner. The 64 memory cell transistors MT (MT0 to MT63) are connected to a bit line and in series between a source of the select transistor SDT and a drain of the select transistor SST. The number of memory cell transistors MT in the memory string MST is not limited to 64.

Each of word lines WL0 to WL63 (denoted as WL when each word line is not distinguished) is commonly connected to a control gate of the memory cell transistor MT in each of the memory strings MST in each string unit SU of the physical block BLK. That is, the control gates of the memory cell transistors MT in the same row in each of the string units SU in the physical block BLK are connected to the same word line WL. Each of the string units SU of the physical block BLK includes a plurality of memory cell groups MCG corresponding to each of the plurality of word lines WL. Each memory cell group MCG includes (p+1) memory cell transistors MT connected to the same word line WL. When each memory cell transistor MT is configured to store a value of 1 bit (when operating in a single-level cell (SLC) mode), the memory group MCG is treated as one physical page. In this case, a data write operation and a data read operation are performed for each physical page.

Each memory cell transistor MT may be configured to store values of a plurality of bits. For example, when each memory cell transistor MT can store values of n (n≥2) bits, a storage capacity per word line WL is equal to a size of n physical pages. That is, each memory cell group MCG is treated as n physical pages. In a multi-level cell (MLC) mode in which each memory cell transistor MT stores a value of 2 bits, data corresponding to two physical pages is stored in each word line WL. In a triple-level cell (TLC)

mode in which each memory cell transistor MT stores a value of 3 bits, data corresponding to three physical pages is stored in each word line WL. In a quad-level cell (QLC) mode in which each memory cell transistor MT stores a value of 4 bits, data corresponding to four physical pages is stored in each word line WL.

Figure 4:
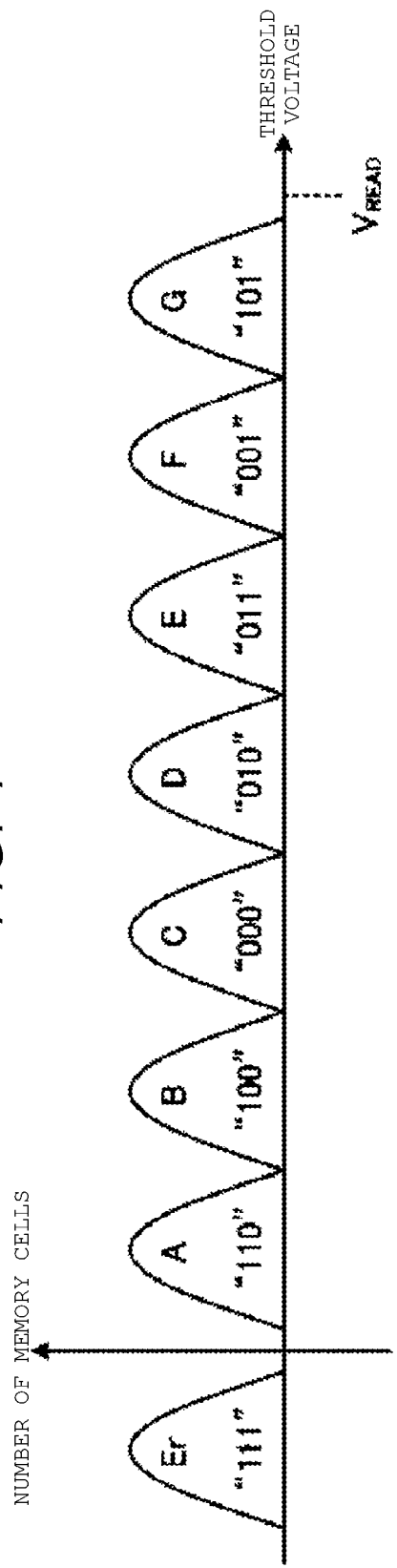
FIG. 4 is a diagram illustrating a threshold voltage distribution of memory cells.

In the TLC mode, a threshold voltage distribution of the memory cells is illustrated in, for example, FIG. 4. FIG. 4 is a diagram illustrating the threshold voltage distribution of the memory cells. In FIG. 4, a horizontal axis represents a threshold voltage, and a vertical axis represents the number of memory cells (specifically, the number of memory cells having a predetermined threshold voltage).

In the TLC mode, each memory cell can store data of 3 bits "xyz" defined by data "x" belonging to an upper page, data "y" belonging to a middle page, and data "z" belonging to a lower page. Values of the data "x", the data "y", and the data "z" are composed of "0" or "1". A threshold voltage of each memory cell is controlled to belong to any one of eight states including an "Er" state, an "A" state, a "B" state, a "C" state, a "D" state, an "E" state, an "F" state, and a "G" state. A correspondence between each state and a data value of the data "xyz" of 3 bits is preset. For example, a data value "111" is assigned to the "Er" state. A data value "110" is assigned to the "A" state. A data value "100" is assigned to the "B" state. A data value "000" is assigned to the "C" state. A data value "010" is assigned to the "D" state. A data value "011" is assigned to the "E" state. A data value "001" is assigned to the "F" state. A data value "101" is assigned to the state. The correspondence between each state and the data values is not limited to the above description.

When writing data to the memory cells, the column module 24 sets a potential of the bit line BL selected as a write target to, for example, 0 V. The row decoder 222 applies a program pulse to the word line WL selected as a write target. Then, electrons are injected into a charge storage film of a memory cell located at an intersection between the selected bit line BL and the selected word line WL, and as a result, a threshold voltage of the memory cell increases. Each time the program pulse is applied, the column module 24 determines whether or not the threshold voltage reaches a voltage corresponding to data to be written. The column module 24 causes the row decoder 222 to continuously apply the program pulse until the threshold voltage reaches the voltage corresponding to the data.

When reading data from the memory cell, the column module 24 precharges the bit line BL with a bit line voltage Vb1 (for example, 1.5 V). The row decoder 222 sequentially applies a plurality of types of read voltages for specifying states for each data value to the selected word line WL. The row decoder 222 applies a read pass voltage $V_{READ}$ to non-selected word lines WL to keep the memory cells belonging to the non-selected word lines WL in a conductive state. The column module 24 determines a data value stored in a target memory cell by detecting a time when a read voltage causing charges stored by precharging to flow out, is applied.

Figure 5:
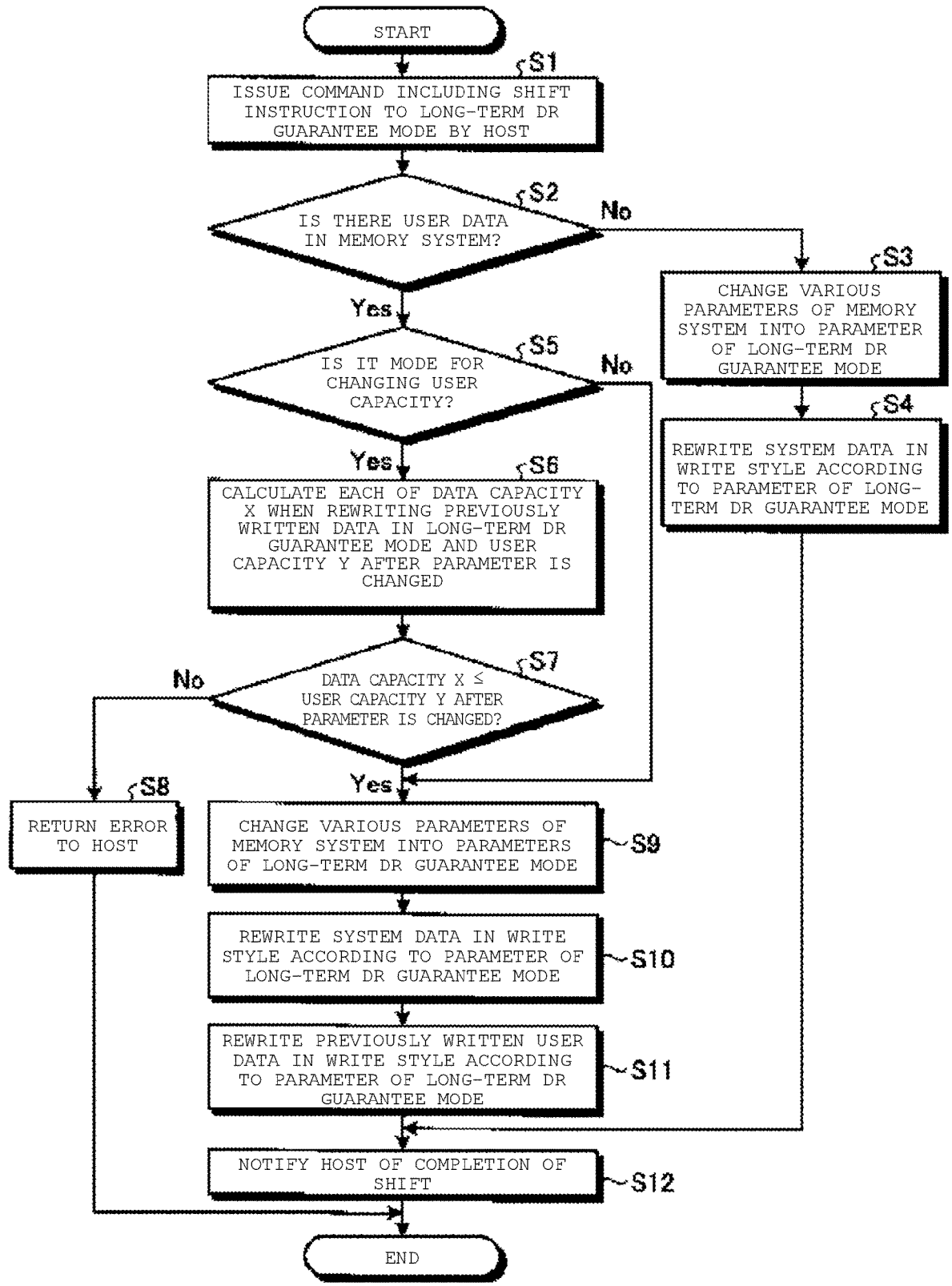
FIG. 5 is a flowchart illustrating a shift operation from the normal mode to the long-term DR guarantee mode in the memory system according to the first embodiment.

Next, an operation of the memory system 1 will be described with reference to FIG. 5. FIG. 5 is a flowchart illustrating a shift operation from a normal mode to a long-term DR guarantee mode.

In the normal mode, the memory controller 10 controls an access operation to each memory cell of the non-volatile memory 20 with default parameters. The access operation is, for example, an operation in which the memory controller 10 writes data to the non-volatile memory 20 or erases the data in the non-volatile memory 20. When the host 30 receives a user request to guarantee DR for a long period, or when the host 30 autonomously determines that the DR will be guaranteed for a long period, a host command CM1 including a shift instruction to the long-term DR guarantee mode is issued from the host 30 (S1). When the host command CM1 is received from the host 30 by the host I/F 15, the memory controller 10 determines whether or not user data exists in the memory system 1 (S2). When the user data does not exist in the memory system 1 (NO in S2), the memory controller 10 changes a parameter in the memory system 1 to a parameter for the long-term DR guarantee mode in response to the host command CM1 (S3). The memory controller 10 rewrites system data in a write style according to the parameters for the long-term DR guarantee mode (S4). That is, the memory controller 10 reads the system data from a management information storage area (not illustrated) of the non-volatile memory 20. The memory controller 10 writes back the read system data to the management information storage area in a write style according to the parameters for the long-term DR guarantee mode. Then, the memory controller 10 returns a notification of shift completion to the host 30 (S12).

When the user data exists in the memory system 1 (YES in S2), the memory controller 10 determines whether or not the long-term DR guarantee mode is a mode that requires a change in user capacity (S5). If the long-term DR guarantee mode is not the mode that requires a change in user capacity (NO in S5), the memory controller 10 proceeds to a process in S9. When the long-term DR guarantee mode is a mode that requires a change in user capacity (YES in S5), the memory controller 10 calculates a data capacity X when the previously written user data is rewritten in a write style according to the parameters for the long-term DR guarantee mode and a user capacity Y of the entire memory system when the parameter is changed (S6). The memory controller 10 may estimate the data capacity X from the number of logical addresses registered in address conversion information. The memory controller 10 determines whether or not the data capacity X is less than or equal to the user capacity Y (S7). When the data capacity X exceeds the user capacity Y (NO in S7), the memory controller 10 returns an error indicating that a shift to the long-term DR guarantee mode is not possible to the host 30 (S8). When the data capacity X is less than or equal to the user capacity Y (YES in S7), the memory controller 10 changes various parameters in the memory system 1 into parameters for the long-term DR guarantee mode (S9). The memory controller 10 rewrites the system data in a write style according to the parameters for the long-term DR guarantee mode (S10). Next, the memory controller 10 rewrites the previously written user data in a write style according to the parameters for the long-term DR guarantee mode (S11). Then, the memory controller 10 returns a notification of shift completion to the host 30 (S12). The notification of shift completion may include a notification that the user capacity is reduced and/or a value of the reduced user capacity.

A shift between the normal mode and the long-term DR guarantee mode may be performed for each storage unit differently from the entire non-volatile memory 20. For example, the shift between the normal mode and the long-term DR guarantee mode may be performed for each memory chip. The shift may be performed for each namespace. The shift may be performed for each logical block. The logical block includes a plurality of physical blocks and is a storage unit for management performed by the memory controller 10.

When the shift between the normal mode and the long-term DR guarantee mode is made for each logical block, a logical block written in a write style according to the parameters for the normal mode during a mode shift and a logical block written in a write style according to the parameters for the long-term DR guarantee mode during the mode shift may exist together in the memory system. Therefore, the memory controller 10 manages which mode each logical block corresponds to. That is, the memory controller 10 performs management in which mode of the normal mode and the long-term DR guarantee mode the writing is performed for each logical block.

For example, mode management information illustrated in FIG. 6 is stored in a management information storage area of the non-volatile memory 20. The memory controller 10 may read the mode management information from the management information storage area when the memory system 1 starts up and store the mode management information in the RAM 14 to manage the mode. FIG. 6 is a diagram illustrating a data structure of the mode management information. The mode management information is information in which block identification information and mode identification information are associated with each other for a plurality of logical blocks. The block identification information (Block Index) is for identifying a logical block. The block identification information is, for example, a block number assigned to a logical block. The mode identification information Mode is for identifying a mode. The mode identification information Mode is, for example, a value of 1 bit, and Mode=0 indicates the normal mode, and Mode=1 indicates the long-term DR guarantee mode. FIG. 6 illustrates a state where logical blocks of block numbers 3 and 4 are controlled in the long-term DR guarantee mode, and the rest of logical blocks are controlled in the normal mode.

The memory controller 10 may normally store the mode management information in the RAM 14. The memory controller 10 may remove the mode management information from the RAM 14 in a situation where all the logical blocks are written only in a write style according to the parameters for the normal mode.

Next, a parameter that can be changed between the normal mode and the long-term DR guarantee mode will be described. In the long-term DR guarantee mode, the parameter is changed to increase a DR stress tolerance as compared with the normal mode.

For example, the parameter is the number of stored bits per memory cell. A change in the parameter requires a change in a user capacity. FIG. 7A is a diagram illustrating the number of stored bits per memory cell as parameters to be set in the normal mode and the long-term DR guarantee mode. As illustrated in FIG. 7A, the memory controller 10 controls an access operation to the memory cell to store data of the number of bits $B_1$ per memory cell in the normal mode. The memory controller 10 controls the access operation to the memory cell to store the data of the number of bits $B_2$ ($<B_1$) per memory cell in the long-term DR guarantee mode. In relation to the DR stress tolerance, a relationship of following Equation 1 is established.

SLC>MLC>TLC>QLC  Equation 1

In the SLC mode, the MLC mode, the TLC mode, and the QLC mode, the number of stored bits per memory cell is 1 bit, 2 bits, 3 bits, and 4 bits, respectively. For example, the memory controller 10 may perform a write operation to a memory cell in the MLC mode in the normal mode and perform a write operation to the memory cell in the SLC mode in the long-term DR guarantee mode. Alternatively, the memory controller 10 may perform a write operation to the memory cell in the TLC mode in the normal mode and perform a write operation to the memory cell in the MLC mode or the SLC mode in the long-term DR guarantee mode. Alternatively, the memory controller 10 may perform a write operation to the memory cell in the QLC mode in the normal mode and perform a write operation to the memory cell in the TLC mode, the MLC mode, or the SLC mode in the long-term DR guarantee mode.

As described above, in the first embodiment, the memory system 1 is provided with the long-term DR guarantee mode for guaranteeing DR for a longer period than a period in the normal mode. The memory system 1 switches an operation mode to the long-term DR guarantee mode according to a host command, and controls an access operation to the non-volatile memory 20. Thereby, the DR of the memory system 1 can be optimized according to a request of a user while ensuring normal performance of the memory system 1. That is, it is possible to guarantee a DR stress tolerance for a long period as compared with a normal use, according to the request of the user.

In the memory system 1 according to the first embodiment, the number of stored bits per memory cell is smaller in the long-term DR guarantee mode than in the normal mode. Thereby, the DR stress tolerance can be guaranteed for a long time.

Second Embodiment

As illustrated in FIG. 7B, a parameter to be modified to increase the DR stress tolerance in the long-term DR guarantee mode may be the code rate described in the first embodiment. A change in the parameter requires a change in a user capacity. FIG. 7B is a diagram illustrating a code rate as parameters to be set in the normal mode and the long-term DR guarantee mode. As illustrated in FIG. 7B, the memory controller 10 controls an access operation to a memory cell to perform an error correction process at a code rate $R_1$ in the normal mode. The memory controller 10 controls the access operation to the memory cell to perform the error correction process at the code rate $R_2$ ($<R_1$) in the long-term DR guarantee mode. In the long-term DR guarantee mode, it can be said that an error correction capability of ECC is enhanced as compared with an error correction capability of ECC in the normal mode. As an example, the number of ECC parity bits for data in a physical page in the long-term DR guarantee mode may be greater than the number of ECC parity bits in the normal mode. As another example, the number of bits of data for ECC parity in the physical page in the long-term DR guarantee mode may be smaller than the number of bits in the normal mode. As another example, the memory controller 10 may generate ECC parity for user data in one chip in the normal mode, and may generate ECC parity for user data stored in a plurality of chips in the long-term DR guarantee mode.

Third Embodiment

A parameter to be modified to increase the DR stress tolerance in the long-term DR guarantee mode may be a size of increase in a program voltage. By reducing the size of increase in the program voltage, a threshold voltage distribution can be narrowed. A change in this parameter does not require a change in user capacity. FIG. 7C is a diagram illustrating the size of increase in the program voltage as parameters to be set in the normal mode and the long-term DR guarantee mode. As illustrated in FIG. 7C, the memory controller 10 controls an access operation to the memory cell such that a write operation is performed with a voltage increase size $\Delta V_1$ in the normal mode. The memory controller 10 controls the access operation to the memory cell such that the write operation is performed with a voltage increase size $\Delta V_2$ ($<\Delta V_1$) in the long-term DR guarantee mode.

Figure 8:
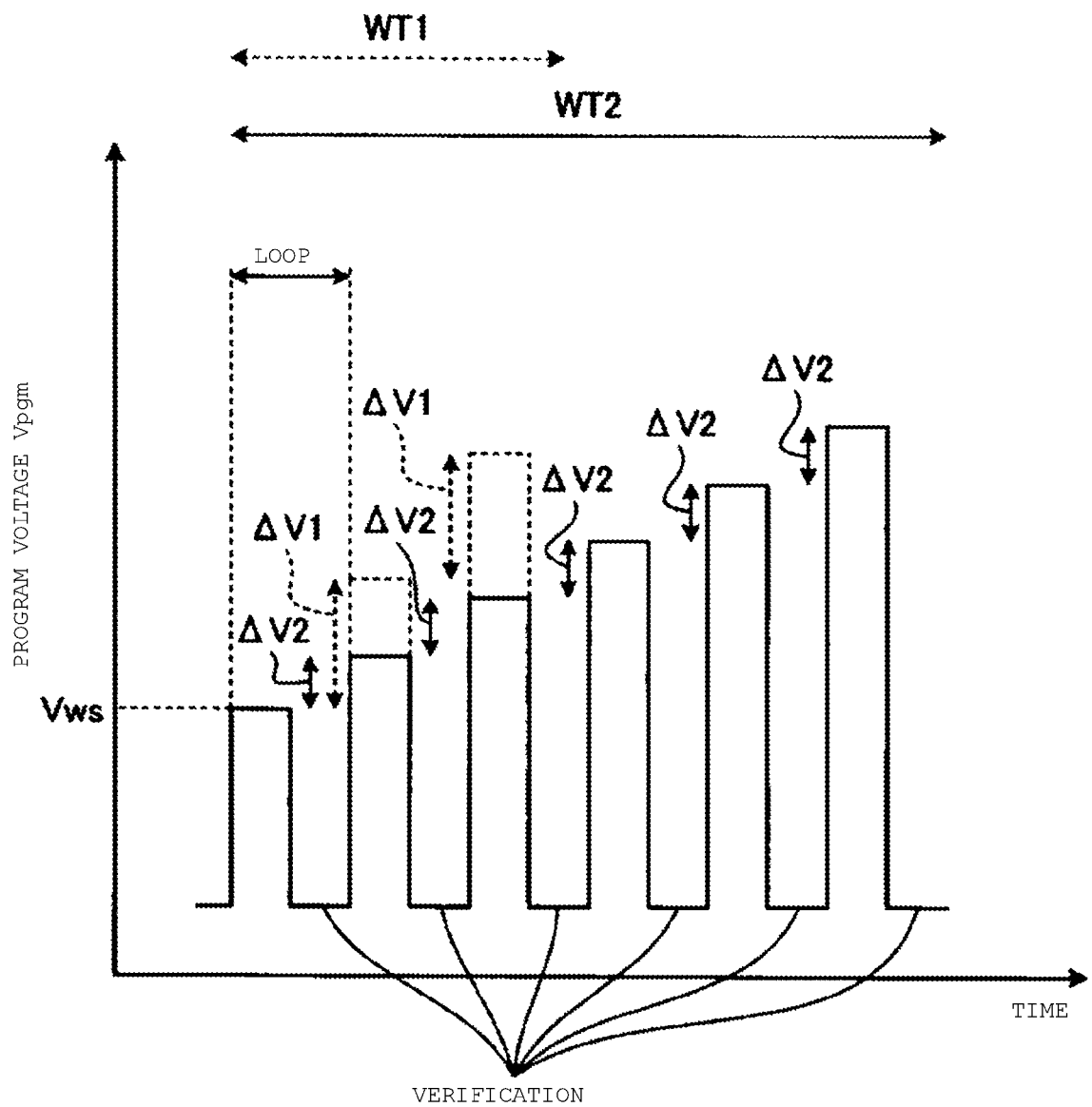
FIG. 8 is a diagram illustrating a write process according to a third embodiment.

FIG. 8 is a diagram illustrating a write process in the normal mode and the long-term DR guarantee mode. In the write process, as illustrated in FIG. 8, after the write operation is performed at a program start voltage Vws and a verification operation is performed, the write operation and the verification operation are repeated while increasing the program voltage by a constant increase size $\Delta V$ until it is determined that the write is successful. In a case of FIG. 8, in the normal mode, the write is completed when the number of loops is 3 at an increase size $\Delta V=\Delta V1$ of the program voltage, and the write time becomes WT1. In the long-term DR guarantee mode, the write is completed when the number of loops is 6 at an increase size $\Delta V=\Delta V_2$ ($<\Delta V_1$) of the program voltage, and the write time becomes WT2 (>WT1).

The effect of this on the threshold voltage distribution is illustrated in FIGS. 9A and 9B. FIGS. 9A and 9B are diagrams illustrating threshold voltage distributions of memory cells in the normal mode and the long-term DR guarantee mode. FIG. 9A illustrates the threshold voltage distribution immediately after write, and FIG. 9B illustrates the threshold voltage distribution after long time elapses. In FIGS. 9A and 9B, dotted lines depicts the threshold voltage distribution in the normal mode, and solid lines depicts the threshold voltage distribution in the long-term DR guarantee mode. For example, when data is written to each memory cell in the TLC mode, a possible range of a threshold voltage of each memory cell is divided into eight ranges of an "Er" state, an "A" state, a "B" state, a "C" state," a "D" state, an "E" state, a "F" state, and a "G" state in descending order of the threshold voltage, as described above. Verification voltages Vfa, Vfb, Vfc, Vfd, Vfe, Vff, and Vfg of the "A" state, the "B" state, the "C" state, the "D" state, the "E" state, the "F" state, and the "G" state are assumed to be determined as illustrated in FIG. 9A. At this time, in the write process in the normal mode, the threshold voltage of the memory cell is brought closer to the verification voltage Vfa to Vfg from a low voltage side by using the relatively large increase size $\Delta V=\Delta V_1$ of the program voltage, and thereby, widths of the state and the "G" state become larger as illustrated by the dotted line in FIG. 9A. Therefore, in the normal mode, if a long period elapses, overlap between the states is increased as illustrated by dotted lines in FIG. 9B and a bit error rate during reading can increase. In the write process in the long-term DR guarantee mode, the threshold voltage of the memory cell is brought closer to the verification voltages Vfa to Vfg from a low voltage side by using the relatively small increase size $\Delta V=\Delta V_2$ ($<\Delta V_1$) of the program voltage, and thereby, widths of the "A" state to the "G" state are narrowed as illustrated by solid lines in FIG. 9A. Thereby, in the long-term DR guarantee mode, even after a long period elapses, overlap between the states is reduced as illustrated by the solid lines in FIG. 9B, and the bit error rate during reading can be reduced.

Fourth Embodiment

A parameter to be modified to increase the DR stress tolerance in the long-term DR guarantee mode may be a size of increase of an erasing voltage. A word line of a block to be erased is set to a voltage of 0 V, and a positive voltage is applied to a substrate of a memory cell array. Thereby, the memory cell discharges electric charges and enters an erased state. The erasing voltage refers to a positive voltage applied to the substrate. By reducing an increase size of the erasing voltage, a width of the threshold voltage distribution in the erased state can be narrowed. A change in this parameter does not require a change in user capacity. The memory controller 10 controls an access operation to the memory cell such that the erasing operation is performed with a voltage increase size $\Delta V_{e1}$ in the normal mode. The memory controller 10 controls the access operation to the memory cell so as to perform the erasing operation with the voltage increase size $\Delta V_{e2}$ ($<\Delta V_{e1}$) in the long-term DR guarantee mode.

In the erasing process, as in a case of the write process illustrated in FIG. 8, after the erasing operation is performed with the erasing start voltage Ves and a verification operation is performed, the erasing operation and the verification operation are repeated while increasing the erasing voltage by a constant increase size $\Delta$Ve until it is determined that erasing is successful. It is assumed that a verification voltage Vfer of the "Er" state is determined as illustrated in FIG. 9A. At this time, in the erasing process in the normal mode, the threshold voltage of the memory cell is brought closer to the verification voltage Vfer from a high voltage side by using the relatively large increase size $\Delta$Ve=$\Delta V_{e1}$ of the erasing voltage, and thereby, a width of the "Er" state is increased as illustrated by dotted lines in FIG. 9A. Thereby, in the normal mode, after a long period elapses, overlap between the "Er" state and the "A" state is increased as illustrated by the dotted lines in FIG. 9B, and a bit error rate during reading may increase. In the erasing process in the long-term DR guarantee mode, the threshold voltage of the memory cell is brought closer to the verification voltage Vfer from the high voltage side by using a relatively small increase size $\Delta$Ve=$\Delta V_{e2}$ ($<\Delta V_{e1}$) of the erasing voltage, and thereby, a width of the "Er" state is narrowed as illustrated by the solid lines in FIG. 9A. Thereby, in the long-term DR guarantee mode, after a long period elapses, overlap between the "Er" state and the "A" state is reduced as illustrated by the solid lines in FIG. 9B, and the bit error rate during reading can be reduced.

Fifth Embodiment

Figure 10A:
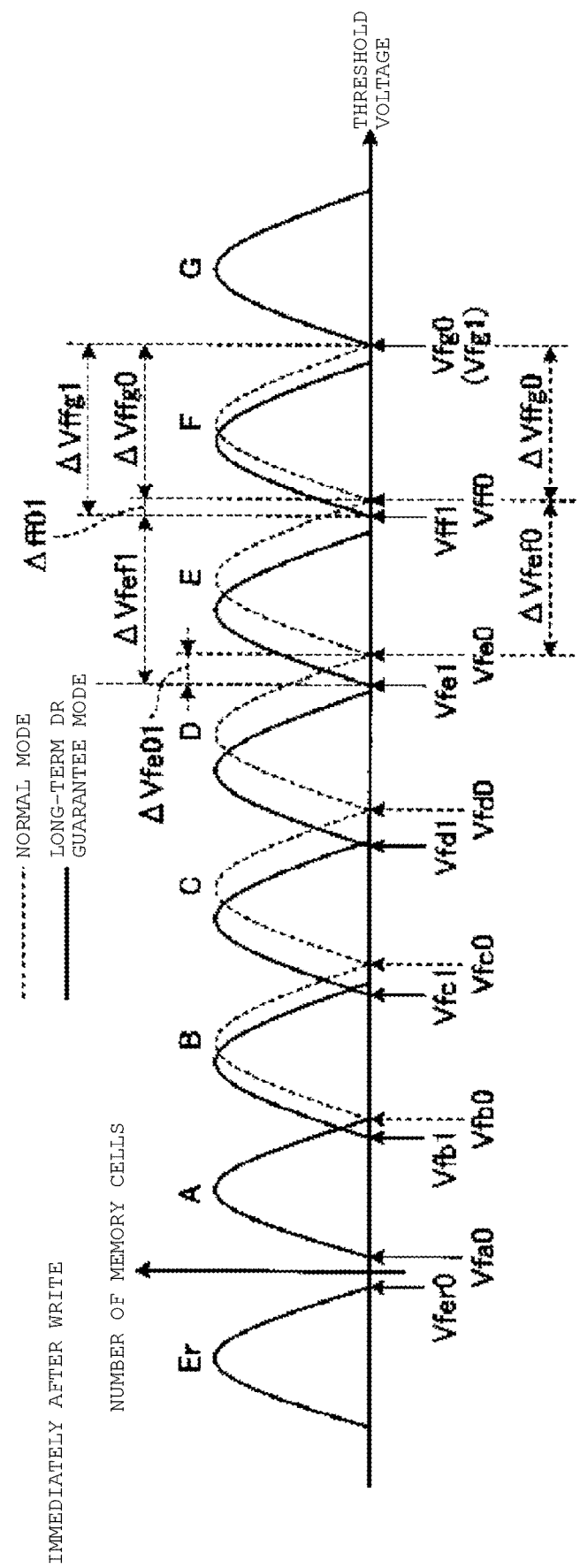

A parameter to be modified to increase the DR stress tolerance in the long-term DR guarantee mode may be a voltage interval between a plurality of verification voltages. This parameter is also referred to as a degree of deviation of the threshold voltage distribution. A change in this parameter does not require a change in user capacity. FIGS. 10A and 10B are diagrams illustrating the threshold voltage distributions of the memory cells in the normal mode and the long-term DR guarantee mode. FIG. 10A illustrates the threshold voltage distribution immediately after writing, and FIG. 10B illustrates the threshold voltage distribution after a long period elapses. In FIGS. 10A and 10B, dotted lines illustrate the threshold voltage distribution in the normal mode, and solid lines illustrate the threshold voltage distribution in the long-term DR guarantee mode. As illustrated in FIGS. 10A and 10B, the memory controller 10 controls an access operation to the memory cell such that a verification operation of the write process in the normal mode is performed with a verification voltage selected from a plurality of verification voltages determined by a default voltage interval. The default voltage interval can be experimentally determined to be collectively resistant to PD stress, DR stress, and RD stress. The memory controller 10 controls the access operation to the memory cell such that the verification operation of the write process in the long-term DR guarantee mode is performed with a verification voltage selected from a plurality of verification voltages including a predetermined voltage interval. The predetermined voltage interval can be experimentally determined such that overlap between the states becomes equal when a long period elapses. Data obtained by performing the verification operation using the predetermined voltage interval is more resistant to the DR stress than data obtained by performing the verification operation using a default voltage interval, while such data may be weak to the PD stress and the RD stress. In FIGS. 10A and 10B, in the long-term DR guarantee mode, a case is illustrated in which a threshold voltage margin between the "E" state and the "F" state, and a threshold voltage margin between the "F" state and the "G" state are widened.

Among the "Er" state to "G" state illustrated in FIG. 10A, a width of the state on a high voltage side tends to widen with time. In this case, the memory controller 10 shifts the verification voltages of the "B" state to the "E" state from verification voltages Vfb0 to Vfe0 in the normal mode to verification voltages Vfb1 to Vfe1 of lower voltages in the long-term DR guarantee mode. Further, the memory controller 10 shifts the verification voltage of the "F" state from the verification voltage Vff0 in the normal mode to the verification voltage Vff1 of a lower voltage in the long-term DR guarantee mode. A verification voltage Vfa1 of the "A" state may be the same as a verification voltage Vfa0 in the normal mode or lower than the verification voltage in the normal mode. FIG. 10A illustrates a case where Vfa1 is the same as Vfa0 and does not illustrate Vfa1. A verification voltage Vfer1 for the erasing process may be the same as a verification voltage Vfer0 in the normal mode or lower than the verification voltage in the normal mode. FIG. 10A illustrates a case where Vfer1 is the same as Vfer0 and does not illustrate Vfer1. At this time, a voltage difference between the verification voltage in the normal mode and the verification voltage in the long-term DR guarantee mode satisfies, for example, the following relationship.

$$\Delta V_{ff01} = Vff0 - Vff1 < \Delta V_{fe01} = Vfe0 - Vfe1$$

$$\Delta V_{fg0} = Vfg0 - Vff0 < \Delta V_{fg1} = Vfg1 - Vff1$$

$$\Delta V_{fef0} = Vff0 - Vfe0 < \Delta V_{fef1} = Vff1 - Vfe1$$

Thereby, a relatively large interval between the states on the high voltage side can be obtained with the long-term DR guarantee mode illustrated by the solid lines in FIG. 10A as compared with the normal mode illustrated by the dotted lines in FIG. 10A. Thereby, after a long period elapses, overlaps between the respective states can be equalized with the long-term DR guarantee mode illustrated by the solid lines in FIG. 10B as compared with the normal mode illustrated by the dotted lines in FIG. 10A, and bit error rates during reading can be equalized in the respective states.

Sixth Embodiment

Figure 11A:
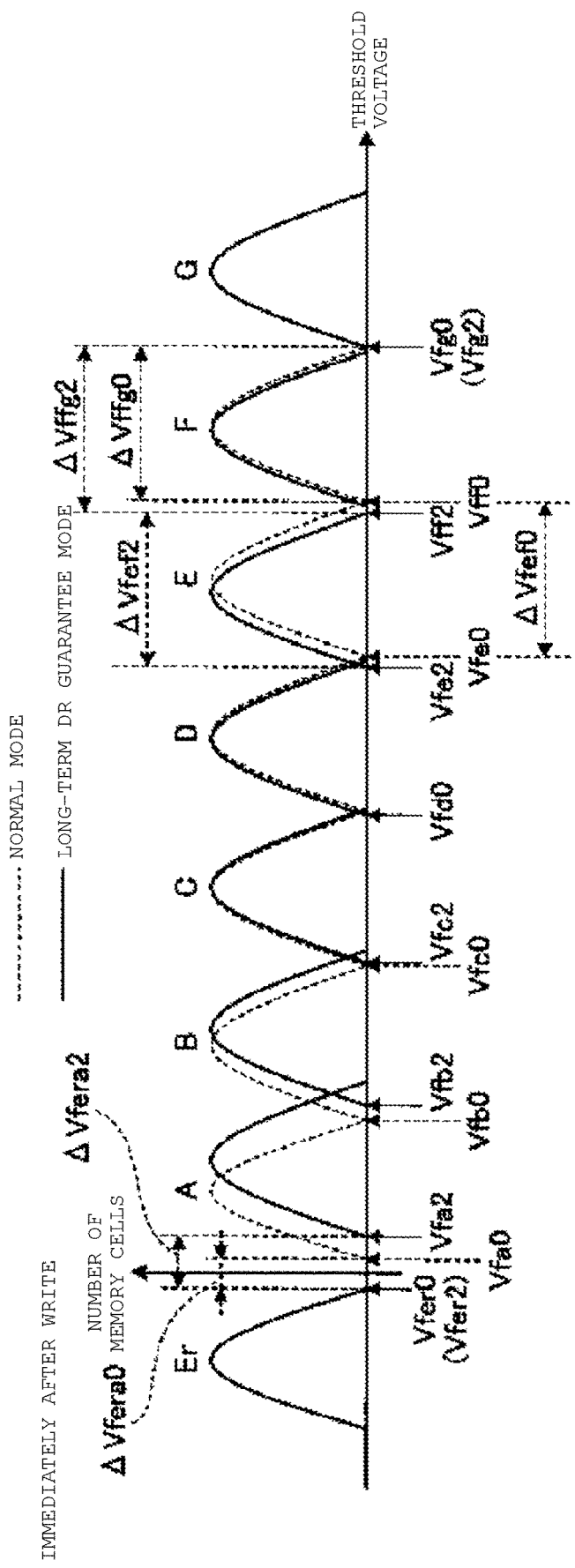
FIGS. 11A and 11B are diagrams illustrating examples of a threshold voltage distribution of memory cells that are programmed according to a sixth embodiment.
Figure 11B:
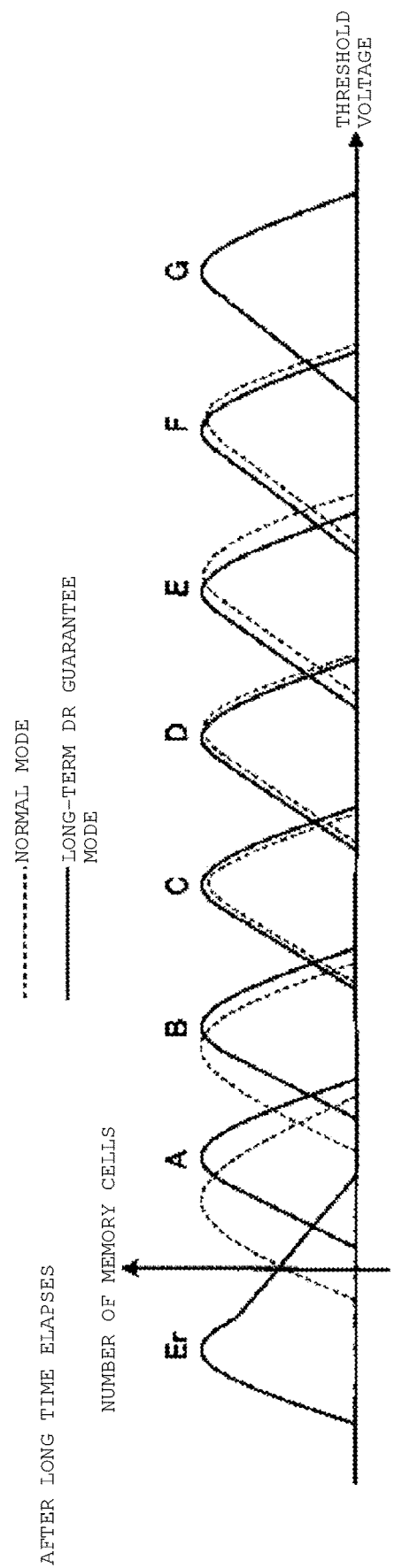

A parameter to be modified to increase the DR stress tolerance in the long-term DR guarantee mode may be a voltage interval between a plurality of verification voltages. A change in this parameter does not require a change in user capacity. FIGS. 11A and 11B are diagrams illustrating the threshold voltage distributions of the memory cells in the normal mode and the long-term DR guarantee mode. FIG. 11A illustrates the threshold voltage distribution immediately after writing, and FIG. 11B illustrates the threshold voltage distribution after a long period elapses. In FIGS. 11A and 11B, dotted lines illustrates the threshold voltage distribution in the normal mode, and solid lines illustrate the threshold voltage distribution in the long-term DR guarantee mode. Among the "Er" to "G" states illustrated in FIG. 11A, overlap between the "Er" state and the "A" state tends to increase with time. In this case, the memory controller 10 shifts the verification voltage of the "A" state from the verification voltage Vfa0 in the normal mode to the verification voltage Vfa2 of higher voltages in the long-term DR guarantee mode. A verification voltage Vfer2 for the erasing process may be the same as a verification voltage Vfer0 in the normal mode or lower than the verification voltage in the normal mode. FIG. 11A illustrates a case where Vfer2 is the same as Vfer0 and does not illustrate Vfer2. At this time, a voltage difference between the verification voltage in the normal mode and the verification voltage in the long-term DR guarantee mode satisfies, for example, the following relationship.

$$\Delta V_{fera0} = Vfa0 - Vfer0 < \Delta V_{fera2} = Vfa2 - Vfer2$$

Further, among the "Er" to "G" states illustrated in FIG. 11A, a width of the state on a high voltage side tends to widen with time. In this case, the memory controller 10 shifts the verification voltages of the "E" state and the "F" state from the verification voltages Vfe0 and Vff0 in the normal mode to the verification voltages Vfe2 and Vff2 of lower voltages in the long-term DR guarantee mode. At this time, a voltage difference between the verification voltage in the normal mode and the verification voltage in the long-term DR guarantee mode satisfies, for example, the following relationship.

$$\Delta V_{fg0} = Vfg0 - Vff0 < \Delta V_{fg2} = Vfg2 - Vff2$$

$$\Delta V_{fef0} = Vff0 - Vfe0 < \Delta V_{fef2} = Vff2 - Vfe2$$

Thereby, a relatively large interval between the "Er" state and the "A" state and relatively large intervals (that is, a space between the "E" state and "F" state and a space between the "F" state and "G" state) between the states on the high voltage side can be obtained with the long-term DR guarantee mode illustrated by the solid lines in FIG. 11A as compared with the normal mode illustrated by the dotted lines in FIG. 11A. As a result, after a long period elapses, the overlaps between the respective states can be equalized, and bit error rates during reading can be equalized in the respective states as illustrated in FIG. 11B.

Seventh Embodiment

A parameter to be modified to increase the DR stress tolerance in long-term DR guarantee mode may be an interval between the word lines for writing data. Changing this parameter may require a change in the user capacity. In the normal mode, the memory controller 10 may control the access operation to the memory cell so as to sequentially select adjacent word lines from among the plurality of word lines of the memory cell array 23 to write data. However, when the adjacent word lines are sequentially selected to write data, a bit error rate may be reduced due to an electric field interference between the word lines.

Figure 12:
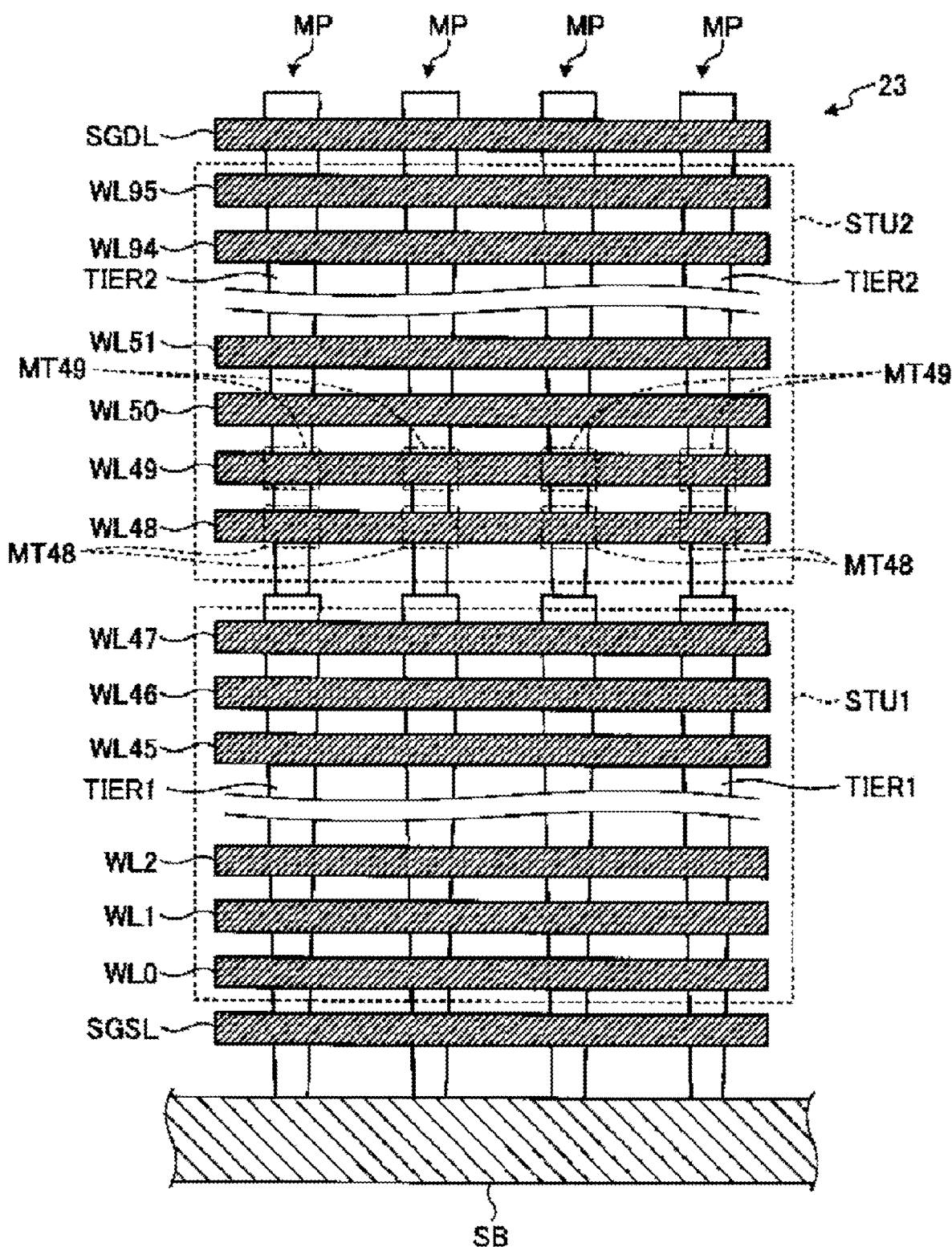
FIG. 12 is a cross-sectional view illustrating a structure of each physical block according to a seventh embodiment.

When the non-volatile memory 20 is a three-dimensional memory, a structure of each physical block in the memory cell array may have the configuration illustrated in FIG. 12.

FIG. 12 is a cross-sectional view illustrating a plurality of stacked units in each physical block. In FIG. 12, an interlayer insulating film is not illustrated simplify the illustration.

In the memory cell array 23 illustrated in FIG. 12, a word line group is arranged above a substrate SB. A plurality of word lines WL0, WL1, . . . , WL47, WL48, WL49, . . . , WL94, and WL95 are sequentially stacked in the word line group. Each of the word lines WL0 to WL95 has a plate shape extending in a plane direction, and an electric field interference easily occurs between adjacent word lines in a stack direction.

In the long-term DR guarantee mode, the memory controller 10 controls an access operation to the memory cell so as to write data via a plurality of word lines WL selected every N (N is an integer of 1 or more) word lines among the plurality of word lines WL0 to WL95 of the memory cell array 23. When the mode is switched in the entire non-volatile memory 20, a maximum capacity of data that can be stored in the memory cell array 23 becomes 1/(1+N) in the long-term DR guarantee mode as compared with the normal mode. For example, in the normal mode, the memory controller 10 controls an access operation to the memory cell so as to write data via every one word line selected from the plurality of word lines WL. In the long term DR guarantee mode, the memory controller 10 controls an access operation to the memory cell so as to write data via every two word lines selected from the plurality of word lines WL. In this case, the controller can use memory cells to write data connected to only ½ word lines of all the word lines. Thus, when the mode is switched in the entire non-volatile memory 20, the maximum capacity of data that can be stored in the memory cell array 23 becomes ½ in the long-term DR guarantee mode as compared with the normal mode. When the maximum capacity is less than a user capacity, it is necessary to change the user capacity.

For example, when a write command including write data corresponding to four word lines is received from the host 30, the memory controller 10 selects a plurality of consecutive word lines WL0 to WL3 and sequentially writes the write data to the selected word lines in the normal mode. When N=1 in the long-term DR guarantee mode, the memory controller 10 selects, for example, even-numbered word lines WL0, WL2, WL4, and WL6 and sequentially writes the write data to the selected word lines. The memory controller 10 may leave unselected odd-numbered word lines in an erased state without writing any data thereto. Alternatively, the memory controller 10 writes dummy data to the non-selected odd-numbered word lines WL1, WL3, and WL5. The dummy data may be data corresponding to the "D" state. The dummy data may also be random data. The dummy data is written to the non-selected odd-numbered word lines to reduce an interference between memory cells. A physical address including the dummy data is not registered in address conversion information.

Further, in the memory cell array 23 illustrated in FIG. 12, a plurality of memory pillars MP are arranged in a plane direction. The memory pillars MP extend in a stack direction and penetrate the word lines WL0 to WL95. The memory pillars MP may have a structure in which a plurality of tiers are stacked. In a case of FIG. 12, the memory pillars MP have a structure in which a tier TIER1 and a tier TIER2 are stacked. The plurality of word lines WL0 to WL95 are divided into a stack unit STU1 and a stack unit STU2. The stack unit STU1 corresponds to the tier TIER1 and includes the plurality of word lines WL0 to WL47. The stack unit STU2 corresponds to the tier TIER2 and includes the plurality of word lines WL48 to WL95.

An electric field between a control gate and a channel region of the memory cell may change discontinuously during a write operation near the tier boundary in a stack direction of the memory cell array 23. Therefore, write characteristics may change in the memory cells near the tier boundary.

In consideration of this, the memory controller 10 may control the write operation to the memory cell so as to skip the word lines arranged at a position where the electric field can change discontinuously. In a case of FIG. 12, the memory controller 10 may skip the word lines WL0 and WL47 located near the boundary of the stack unit STU1 to select word lines. The memory controller 10 may skip the word lines WL48 and WL95 located near the boundary of the stack unit STU2 to select word lines. Alternatively, the memory controller 10 may skip word lines that are expected to be unreliable even if the word lines are located near the center of the stack unit.

Eighth Embodiment

Figure 13B:
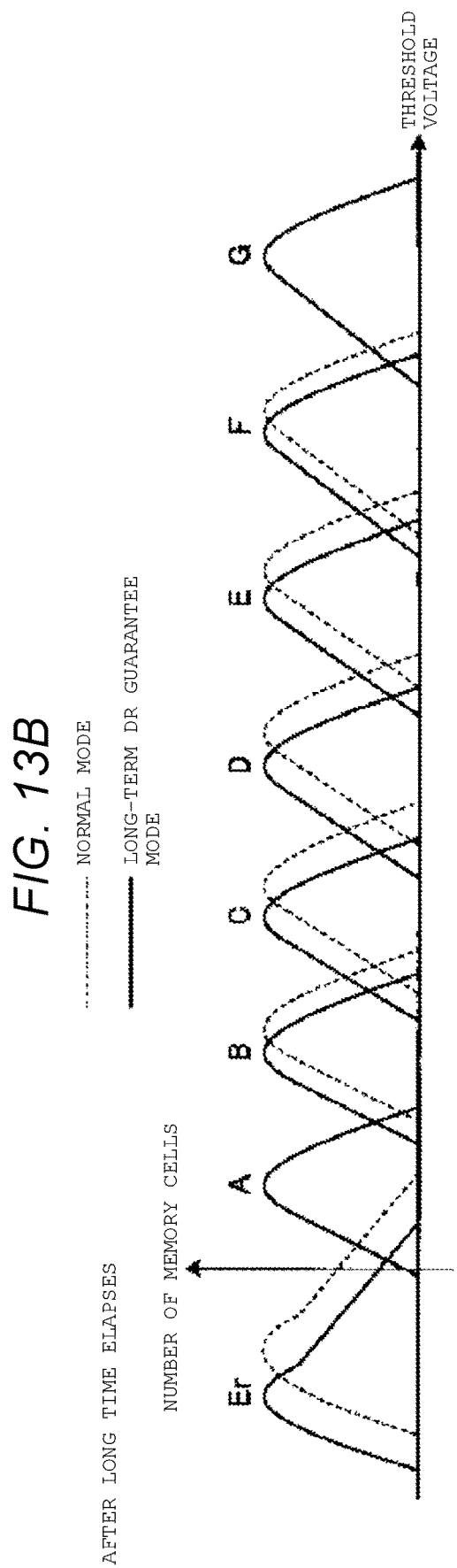

A parameter to be modified to increase the DR stress tolerance in the long-term DR guarantee mode may be a verification voltage during the erasing process. A change in this parameter does not require a change in user capacity. FIGS. 13A and 13B are diagrams illustrating examples of the threshold voltage distributions of the memory cells. FIG. 13A illustrates the threshold voltage distribution immediately after writing, and FIG. 13B illustrates the threshold voltage distribution after a long period elapses. In FIGS. 13A and 13B, dotted lines illustrate the threshold voltage distribution in the normal mode, and solid lines illustrate the threshold voltage distribution in the long-term DR guarantee mode. As illustrated by the dotted lines in FIG. 13A, the memory controller 10 controls an access operation to the memory cell such that a verification operation in the erasing process is performed with the verification voltage Vfer0 in the normal mode. The memory controller 10 has a wide threshold voltage margin between the "Er" state and the "A" state in the long-term DR guarantee mode. Therefore, the memory controller 10 locates the "Er" state at a lower voltage. For example, as illustrated by the solid lines in FIG. 13A, the memory controller 10 controls an access operation to the memory cells such that the verification operation in the erasing process is performed with the verification voltage Vfer3 (<Vfer0) in the long-term DR guarantee mode. The memory controller 10 performs a deeper erasing operation in the long-term DR guarantee mode than in the normal mode.

For example, when the overlap between the "Er" state and the "A" state tends to increase with time, the memory controller 10 shifts the verification voltage of the "Er" state among the "Er" state to the "G" state illustrated in FIG. 13A from the verification voltage Vfer0 in the normal mode to the verification voltage Vfer3 of a lower voltage in the long-term DR guarantee mode. The verification voltage Vfa3 of the "A" state may be the same as the verification voltage Vfa0 in the normal mode or may be higher than the verification voltage in the normal mode. FIG. 13A illustrates a case where Vfa3 is the same as Vfa0 and does not illustrate Vfa3. At this time, a voltage difference between the verification voltage in the normal mode and the verification voltage in the long-term DR guarantee mode satisfies, for example, the following relationship.

$$\Delta V_{fera0} = Vfa0 - Vfer0 < \Delta V_{fera3} = Vfa3 - Vfer3$$

Thereby, a relatively large interval between the "Er" state and the "A" state can be obtained. Further, there is a margin for shifting the "B" state to the "F" state as compared with a case where the verification voltage of the "Er" state is not shifted to a low voltage side. Thus, for example, when a width of the state on a high voltage side tends to widen with time, the memory controller 10 may shift the verification voltages of the "B" state to the "F" state from the verification voltages Vfb0 to Vff0 in the normal mode to the verification voltages Vfb3 to Vff3 of lower voltages in the long-term DR guarantee mode. Thereby, a relatively large interval between the "Er" state and the "A" state and a relatively large interval between the states on the high voltage side can be obtained with the long-term DR guarantee mode illustrated by the solid lines in FIG. 13A as compared with the states in the normal mode illustrated by the dotted lines in FIG. 13A. Thereby, after a long period elapses, the overlaps between the respective states in the long-term DR guarantee mode can be equalized and reduced as illustrated by the solid lines in FIG. 13B as compared with the states in the normal mode illustrated by the dotted line sin FIG. 13B. As a result, bit error rates during reading can be equalized and reduced in the respective states.

Ninth Embodiment

Figure 14A:
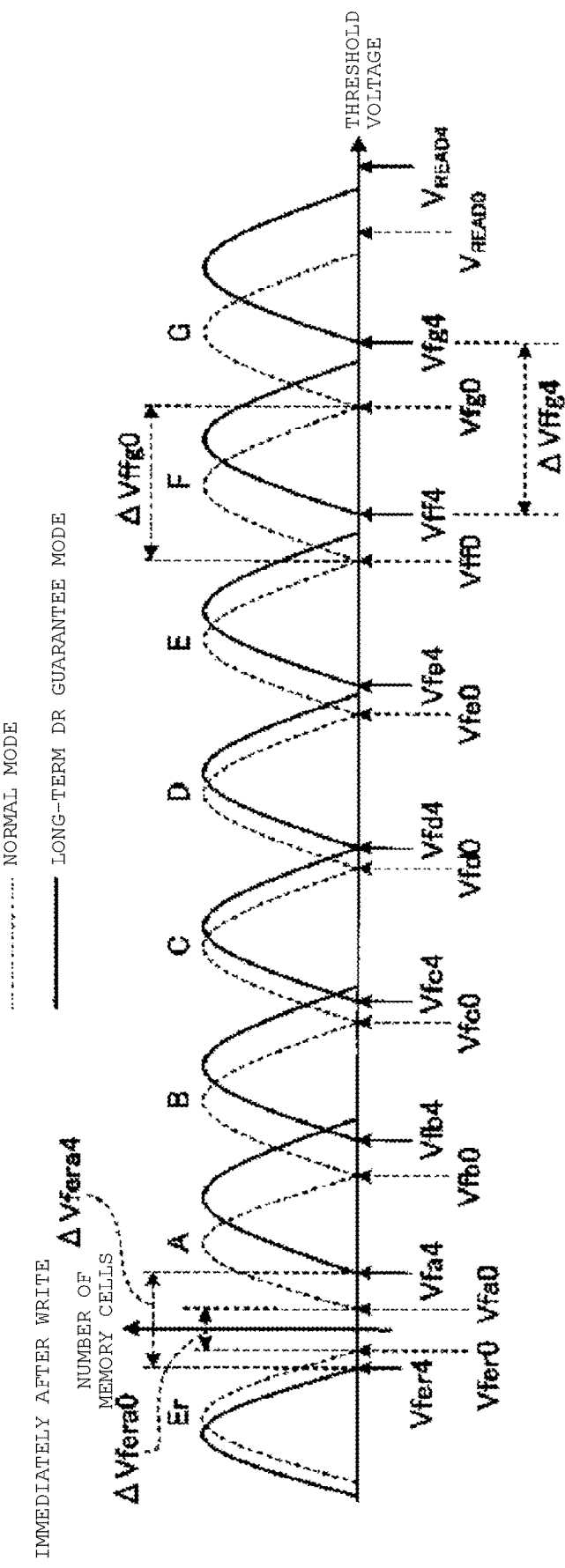
FIGS. 14A and 14B are diagrams illustrating examples of a threshold voltage distribution of memory cells that are programmed according to a ninth embodiment.
Figure 14B:
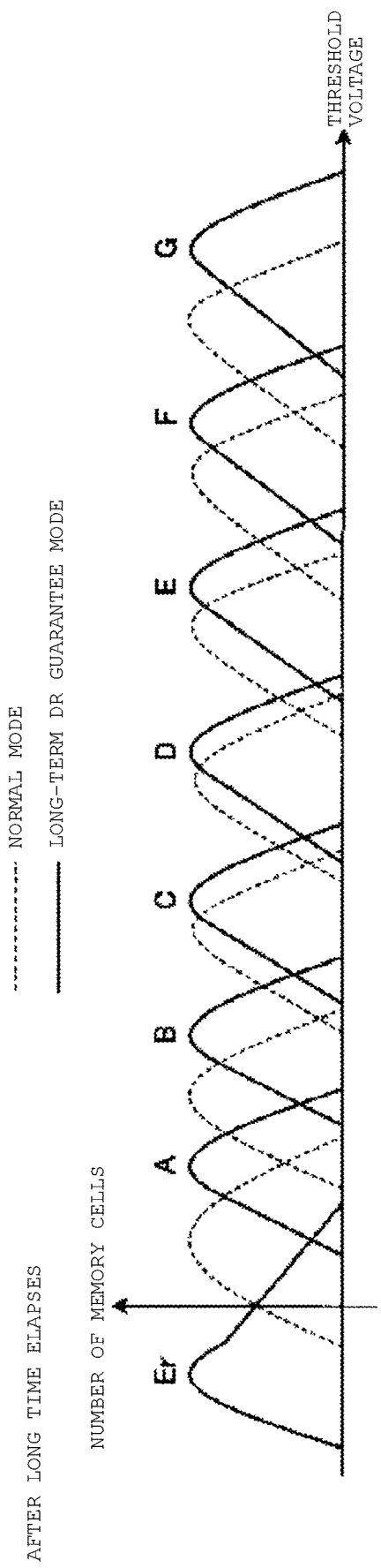

A parameter to be modified to increase the DR stress tolerance in the long-term DR guarantee mode may be a voltage interval between a plurality of the verification voltages illustrated in FIGS. 14A and 14B. A change in this parameter does not require a change in user capacity. FIGS. 14A and 14B are diagrams illustrating the threshold voltage distributions of the memory cells in the normal mode and the long-term DR guarantee mode. FIG. 14A illustrates the threshold voltage distributions immediately after writing, and FIG. 14B illustrates the threshold voltage distribution after a long period elapses. In FIGS. 14A and 14B, dotted lines illustrate the threshold voltage distributions in the normal mode, and solid lines illustrate the threshold voltage distributions in the long-term DR guarantee mode. As illustrated by the solid lines in FIG. 14A, the memory controller 10 shifts the verification voltages of the "A" state to the "G" state from the verification voltages Vfa0 to Vfg0 in the normal mode to the verification voltages Vfa4 to Vfg4 of higher voltages in the long-term DR guarantee mode. The verification voltage Vfer4 in the erasing process may be the same as the verification voltage Vfer0 in the normal mode or may be lower than the verification voltage in the normal mode. FIG. 14A illustrates a case where Vfer4 is lower than Vfer0. At this time, a voltage difference between the verification voltage in the normal mode and the verification voltage in the long-term DR guarantee mode satisfies, for example, the following relationship.

$$\Delta V_{fera0} = Vfa0 - Vfer0 < \Delta V_{fera4} = Vfa4 - Vfer4$$

$$\Delta V_{ffg0} = Vfg0 - Vff0 < \Delta V_{ffg4} = Vfg4 - Vff4$$

Also by this, a relatively large interval between the "Er" state and the "A" state and a relatively large interval between the states on a high voltage side can be obtained with the long-term DR guarantee mode illustrated by the solid lines in FIG. 14A as compared with the normal mode illustrated by the dotted lines in FIG. 14A. Thereby, after a long period elapses, the overlaps between the respective states can be equalized and reduced in the long-term DR guarantee mode as illustrated by the solid lines in FIG. 14B as compared with the normal mode illustrated by the dotted line sin FIG. 14B, and thus, bit error rates during reading can be equalized and reduced in the respective states.

The "G" state is shifted to a high voltage side with the long-term DR guarantee mode illustrated by the solid lines in FIG. 14A, as compared with the normal mode illustrated by the dotted lines in FIG. 14A, and thus, a read pass voltage $V_{READ}$ applied to the non-selected word lines is set to a higher voltage during a read process. That is, in the read process in the normal mode, the memory controller 10 performs a read operation while applying a read pass voltage $V_{READ0}$ to the non-selected word lines. The memory controller 10 performs a read operation while applying a read pass voltage $V_{READ4}$ ($>V_{READ0}$) to the non-selected word lines during the read process in the long-term DR guarantee mode. Further, during a verification operation of the write process in the normal mode, the memory controller 10 applies each of the verification voltages Vfa0 to Vfg0 to the selected word lines to perform the verification operation while applying the read pass voltage $V_{READ0}$ to the non-selected word lines. During the verification operation of the write process in the long-term DR guarantee mode, the memory controller 10 applies each of the verification voltages Vfa4 to Vfg4 to the selected word lines to perform the verification operation while applying the read pass voltage $V_{READ4}$ ($>V_{READ0}$) to the non-selected word lines. That is, the memory controller 10 sets the read pass voltage $V_{READ4}$ in the long-term DR guarantee mode illustrated by the solid line in FIG. 14A to a voltage higher than the read pass voltage $V_{READ0}$ in the normal mode illustrated by the dotted line in FIG. 14A.

Modificatioin Examples

Modification examples of the first to ninth embodiments will be described.

When an erasing operation in the long-term DR guarantee mode is performed deeper than an erasing operation in the normal mode, the memory cells are worn out to a greater degree by the erasing operation. Therefore, the number of allowable write/erasing of the memory cells may be reduced.

When a temperature crossover indicating a difference between a temperature during a write process and a temperature during a read process is increased, a bit error rate can be increased. Particularly, the memory cell may be worn out more easily in the long-term DR guarantee mode than in the normal mode, and thus, it is desirable to reduce influence of the temperature crossover. Therefore, a difference between the temperature during the write process and the temperature during the read process may be reduced by reducing a range between a writable temperature and a readable temperature in the long-term DR guarantee mode more than in the normal mode.

Since the write/read parameters are different between the normal mode and the long-term DR guarantee mode, the write parameters and the read parameters may be prepared for each mode. At this time, parameters may be used separately for each storage unit by using mode management information illustrated in FIG. 6. In a logical block used in the normal mode, data is written in a write style according to the write parameters for the normal mode, and data is read by using a read style according to the read parameters for the normal mode. In a logical block used in the long-term DR guarantee mode, data is written in a write style according to the write parameter for the long-term DR guarantee mode, and data is read by using a read style according to the read parameter for the long-term DR guarantee mode.

For example, in the long-term DR guarantee mode, a read voltage during a read process or a search center voltage (and a search width) of Vth tracking (tracking read) may also be a value shifted according to the write parameter. The Vth tracking is, for example, an operation of generating a histogram of threshold voltages of a plurality of memory cells in a certain page by performing a read operation a plurality of times while shifting the read voltage by a predetermined width, and searching for a voltage level at which the number of error bits is minimized based on the generated histogram. When a threshold voltage distribution is shifted during a write process in the long-term DR guarantee mode, the read voltage during the read process and the search center voltage (and the search width) of the Vth tracking may be shifted according thereto.

When an ECC code rate is reduced in the long-term DR guarantee mode, a setting parameter during decoding may be changed according thereto.

A change in parameters and the like described in the first to ninth embodiments may be combined in any manner. Particularly, a change in the verification voltage intervals described in the fifth, sixth, eighth, and ninth embodiments may be combined in any manner.

Tenth Embodiment

A return from the long-term DR guarantee mode to the normal mode may be made by a method illustrated in FIG. 15. FIG. 15 is a flowchart illustrating an operation of returning from the long-term DR guarantee mode to the normal mode of the memory system according to a tenth embodiment.

In the method illustrated in FIG. 15, a host command for a return instruction is explicitly sent from the host 30, and a mode is returned to the normal mode according to the host command. As illustrated in FIG. 15, the memory controller 10 controls an access operation to the memory cell by switching from the long-term DR guarantee mode to the normal mode as the host I/F 15 receives a host command CM3 including the return instruction to the normal mode. An operation of FIG. 15 is assumed to start, for example, when required to quickly increase performance of the memory system 1 and/or to write a large amount of write data to the memory system 1, and the like.

When the host 30 receives a user request to return to the normal mode, or when the host 30 autonomously determines to return to the normal mode, the host command CM3 including an instruction to return to the normal mode is issued by the host 30 (S21). The memory controller 10 changes parameters in the memory system 1 into parameters for the normal mode according to the host command CM3 (S22). The memory controller 10 rewrites system data in a write style according to the parameters for the normal mode (S23).

Next, the memory controller 10 determines whether or not user data exists in the memory system 1 (S24). When the user data exists in the memory system 1 (YES in S24), the memory controller 10 rewrites the previously written user data to the non-volatile memory 20 in a write style according to the parameters for the normal mode (S25). When the user data does not exist in the memory system 1 (NO in S24), or after the process of S25, the memory controller 10 returns a notification of completion of returning to the normal mode to the host 30 (S26).

Eleventh Embodiment

A return from the long-term DR guarantee mode to the normal mode may be made by a method illustrated in FIG. 16. FIG. 16 is a flowchart illustrating an operation of returning from the long-term DR guarantee mode to the normal mode of the memory system according to the eleventh embodiment. In the method illustrated in FIG. 16, the return to the normal mode is made according to a determination by the memory system. As illustrated in FIG. 16, the memory controller 10 controls the access operation to the memory cell while gradually switching parameters.

When the host write command is issued by the host 30 and received by the host I/F 15 (S31), the memory controller 10 determines whether or not a current mode is the long-term DR guarantee mode (S32). When the current mode is the normal mode (NO in S32), the memory controller 10 ends the process. When the current mode is the long-term DR guarantee mode (YES in S32), the memory controller 10 determines whether or not an LBA map rate is higher than a threshold value Z (S33). The threshold value Z is set at a value that is out of an allowable range of the long-term DR guarantee mode and is, for example, several tens of percent. When the LBA map rate is less than or equal to the threshold value Z (NO in S33), the memory controller 10 considers that the LBA map rate is within the allowable range of the long-term DR guarantee mode and ends the process without returning to the normal mode. When the LBA map rate exceeds the threshold value Z (YES in S33), the memory controller 10 considers that the LBA map rate is out of the allowable range of the long-term DR guarantee mode and partially changes various parameters in the memory system 1 into parameters for the normal mode (S34). For example, the memory controller 10 may rewrite system data or user data written in a write style according to parameters for the long-term DR guarantee mode in a write style according to parameters for the normal mode at a timing of an internal process such as compaction or refresh that does not depend on the host command. Alternatively, the memory controller may change some of a plurality of parameters into parameters for the normal mode such that there is a decrease in wear-out and performance reduction due to the write/erasing process. The memory controller 10 may rewrite data in a write style according to parameters for the normal mode for some of storage units among a plurality of the storage units in which data is written in a write style according to parameters for the long-term DR guarantee mode. The memory controller 10 notifies the host 30 of a return to the normal mode and a return range (S35). The notification may, for example, indicate which of the plurality of parameters is changed for the normal mode. The notification may indicate which of the plurality of storage units is changed for the normal mode or may be a range of a logical address.

An operation of FIG. 16 may be repeated until a return to the normal mode is completed.

Twelfth Embodiment

In a twelfth embodiment, the memory system is provided with a performance priority mode that operates at a write speed and an erasing speed faster than speeds in the normal mode. The memory system according to the present embodiment switches to the performance priority mode according to a host command to control the non-volatile memory. Thereby, the memory system can increase the write speed and the erasing speed according to a request of the host.

Specifically, the memory system writes data at a first speed in the normal mode. The memory system writes data at a second speed faster than the first speed in the performance priority mode. Further, the memory system erases data at a third speed in the normal mode. The memory system erases data at a fourth speed faster than the third speed in the performance priority mode.

When writing and erasing the data, parameters that that cause less wear-out are used in the normal mode. Parameters that cause greater wear-out are used in the performance priority mode. A parameter with greater wear-out is also a write condition with a relatively high write speed. The parameter with greater wear-out is also an erasing condition in which the erasing speed is relatively fast. In the performance priority mode, when the power is off, DR is not guaranteed to the same extent as in the normal mode, if necessary.

After being shifted from the normal mode to the performance priority mode, the memory system writes the newly written user data in a write style according to parameters for the performance priority mode. After being shifted from the normal mode to the performance priority mode, the memory system does not need to refresh (that is, rewrite) the user data previously written in the write style according to the parameters for the performance priority mode.

Figures 17B, 17C, 18:
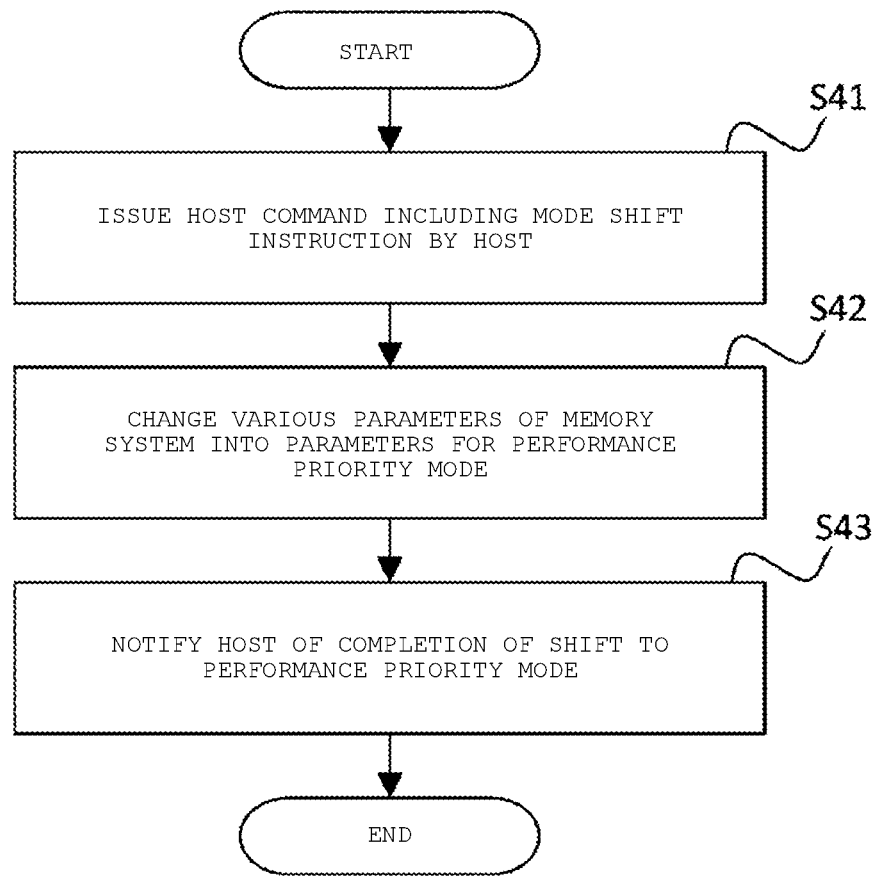

In the performance priority mode, the write and erasing speeds are prioritized at the expense of other characteristics as compared with the normal mode. That is, as illustrated in FIGS. 17A to 17C, there is a trade-off relationship between respective parameters relating to the write to the non-volatile memory. FIGS. 17A to 17C are diagrams illustrating characteristics of the normal mode and the performance priority mode.

As illustrated in FIG. 17A, the parameters DR, PD, and RD relating to reliability of the memory cell have a trade-off relationship between the normal mode and the performance priority mode. As illustrated in FIG. 17A, in the normal mode, parameters are set to balance tolerances for each stress of DR, PD, and RD, and thus, all the parameters may be relatively good. In the performance priority mode, the data write and erasing speeds are prioritized, and thus, DR, PD, and RD may be poor.

As illustrated in FIG. 17B, DR and cell wear-out have a trade-off relationship between the normal mode and the performance priority mode. The cell wear-out indicates a degree of wear-out of the memory cell due to one-time write/erasing process to the memory cell. As illustrated in FIG. 17B, parameters are set to balance tolerance for DR stress and the cell wear-out in the normal mode, and thus, the tolerance for DR stress and the cell wear-out may be relatively good. In the performance priority mode, the write and erasing speeds are prioritized and the cell wear-out may be increased, and thus, cell wear-out characteristics may be poor. Alternatively, although a voltage during writing is increased, the number of times that a voltage is applied to the memory cell is reduced, and thus, the cell wear-out is relatively good and may be the same as in the normal mode.

As illustrated in FIG. 17C, the DR and the write performance have a trade-off relationship between the normal mode and the performance priority mode. The write performance means a high speed of a write process and indicates reduction in program time (tPROG). As illustrated in FIG. 17C, in the normal mode, parameters are set to balance tolerance for DR stress and write performance, and thus, the DR stress and write performance may be relatively good. In the normal mode, parameters with a short program time are used to increase write performance of each memory cell. Meanwhile, in the performance priority mode, since the parameter that gives priority to the write performance at the expense of DR stress tolerance is used, the DR may be poor, whereas write performance is very good (excellent).

When the write and erasing speeds are prioritized, an interval is narrowed between adjacent states of the threshold voltage distributions to which the respective memory cells belong. At this time, DR in the performance priority mode is poorer than the DR in the normal mode. Further, when cell wear-out is increased, the memory cell has a low capability to store electrons, and thus, the DR in the performance priority mode is poorer than the DR in the normal mode. That is, write and erasing in the performance priority mode can be said to be at the expense of DR.

As described above, when the write and erasing speeds of the memory system are to be increased at the expense of DR, the host transmits a command to a memory system to switch a mode of the memory system. The memory system that receives the command operates in the performance priority mode. Thereby, a memory system having higher write and erasing speeds than a normal memory system can be operated.

Next, an operation of the memory system 1 will be described with reference to FIG. 18. FIG. 18 is a flowchart illustrating a shift operation of the memory system that shifts from the normal mode to the performance priority mode.

A method illustrated in FIG. 18 is a method in which a host command for explicitly switching a mode of the memory system is sent from the host 30 and the mode is shifted to the performance priority mode according to the host command. As illustrated in FIG. 18, the memory controller 10 controls an access operation to the memory cell by switching from the normal mode to the performance priority mode, in response to the host I/F 15 receiving a host command CM4 including a shift instruction to the performance priority mode. An operation of FIG. 18 is assumed to start, for example, when required to quickly increase performance of the memory system 1 and/or to write a large amount of write data to the memory system 1, and the like.

When the host 30 receives a user request to increase the performance of the memory system, or when the host 30 autonomously determines that the performance of the memory system should be improved, the host command CM4 including a shift instruction to the performance priority mode is issued by the host 30 (S41). The memory controller 10 changes parameters in the memory system 1 into parameters for the performance priority mode according to the host command CM4 (S42). The memory controller 10 returns a notification of completion of a shift to the performance priority mode to the host 30 (S43). Alternatively, the memory controller 10 does not have to return the notification of the completion of the shift.

Further, it is not always necessary to rewrite system data and user data written in a write style according to parameters for the normal mode to parameters for the performance priority mode. During reading, the system data and the user data are read by separately using a read parameter of the data for the normal mode and a read parameter of the data for the performance priority mode. In that case, the notification of completion of a shift from the memory controller 10 to the host may include which storage unit among a plurality of storage units is changed for the performance priority mode and may include which logical address range is changed for the performance priority mode.

A shift between the normal mode and the performance priority mode may be made for each storage unit different from the entire non-volatile memory 20. For example, the shift between the normal mode and the performance priority mode may be made for each memory chip. The shift may be performed for each namespace. The shift may be performed for each logical block. The logical block includes a plurality of physical blocks and is a storage unit for management performed by the memory controller 10.

When the shift between the normal mode and the performance priority mode is made for each logical block, a logical block written in a write style according to the parameters for the normal mode during a mode shift and a logical block written in a write style according to the parameters for the performance priority mode during the mode shift may exist together in the memory system. Therefore, the memory controller 10 manages which mode each logical block corresponds to. That is, the memory controller 10 performs management in which mode of the normal mode and the performance priority mode the writing is performed for each logical block.

As described above, in the twelfth embodiment, the memory system 1 is provided with a performance priority mode for increasing write and erasing speeds of data and improving performance of the memory system. The memory system 1 switches an operation mode to the performance priority mode according to the host command and controls an access operation to the non-volatile memory 20. Thereby, performance of the memory system 1 can be optimized according to a request of a user. That is, the performance of the memory system can be improved according to the request of the user as compared with a normal use.

Thirteenth Embodiment

A shift from the normal mode to the performance priority mode may be made by a method illustrated in FIG. 19. FIG. 19 is a flowchart illustrating a shift operation that the memory system according to the thirteenth embodiment shifts from the normal mode to the performance priority mode. A method illustrated in FIG. 19 is a method of shifting to the performance priority mode according to a determination by the memory system.

When the memory system starts up (S51), the memory controller 10 determines whether or not a continuous operation time after the start-up exceeds a threshold time (S52). When the continuous operation time does not exceed the threshold time (NO in S52), the memory controller 10 returns to an operation of calculating whether or not the continuous operation time exceeds the threshold time. If the continuous operation time exceeds the threshold time (YES in S52), the memory controller 10 changes various parameters in the memory system 1 into parameters for the performance priority mode (S53). The memory controller 10 notifies the host 30 of the shift to the performance priority mode and a range of the shift to the performance priority mode (S54). The notification may indicate, for example, which parameter of a plurality of parameters is changed for the performance priority mode. The notification may include which storage unit of a plurality of storage units is changed for the performance priority mode. Further, the notification may also include which logical address range is changed for the performance priority mode.

Further, a condition other than a time after the start-up exceeding the threshold time, may be set for shifting to the performance priority mode. For example, the condition may include a condition that the amount of written data exceeds a threshold time. Further, the condition may include a condition that the amount of read data exceeds a threshold time.

By doing so, the memory system can shift to the performance priority mode even when a command for shifting to the performance priority mode is not issued from the host to the memory system.

Fourteenth Embodiment

A parameter to be modified to improve performance of the memory system in the performance priority mode may be a size of increase in a program voltage. By increasing the increase size of the program voltage, time for the memory cell to reach a target threshold voltage can be reduced, and time to complete a write operation can be reduced. FIGS. 20A to 20C and 21A to 21C illustrate parameters to be set in the normal mode and the performance priority mode.

FIG. 20A is a diagram illustrating an increase size of a program voltage as a parameters to be set in the normal mode and the performance priority mode. As illustrated in FIG. 20A, the memory controller 10 controls an access operation to the memory cell such that a write operation is performed with a voltage increase size $\Delta V1$ in the normal mode. The memory controller 10 controls the access operation to the memory cell such that the write operation is performed with a voltage increase size $\Delta V3$ ($>\Delta V1$) in the performance priority mode.

Figure 22:
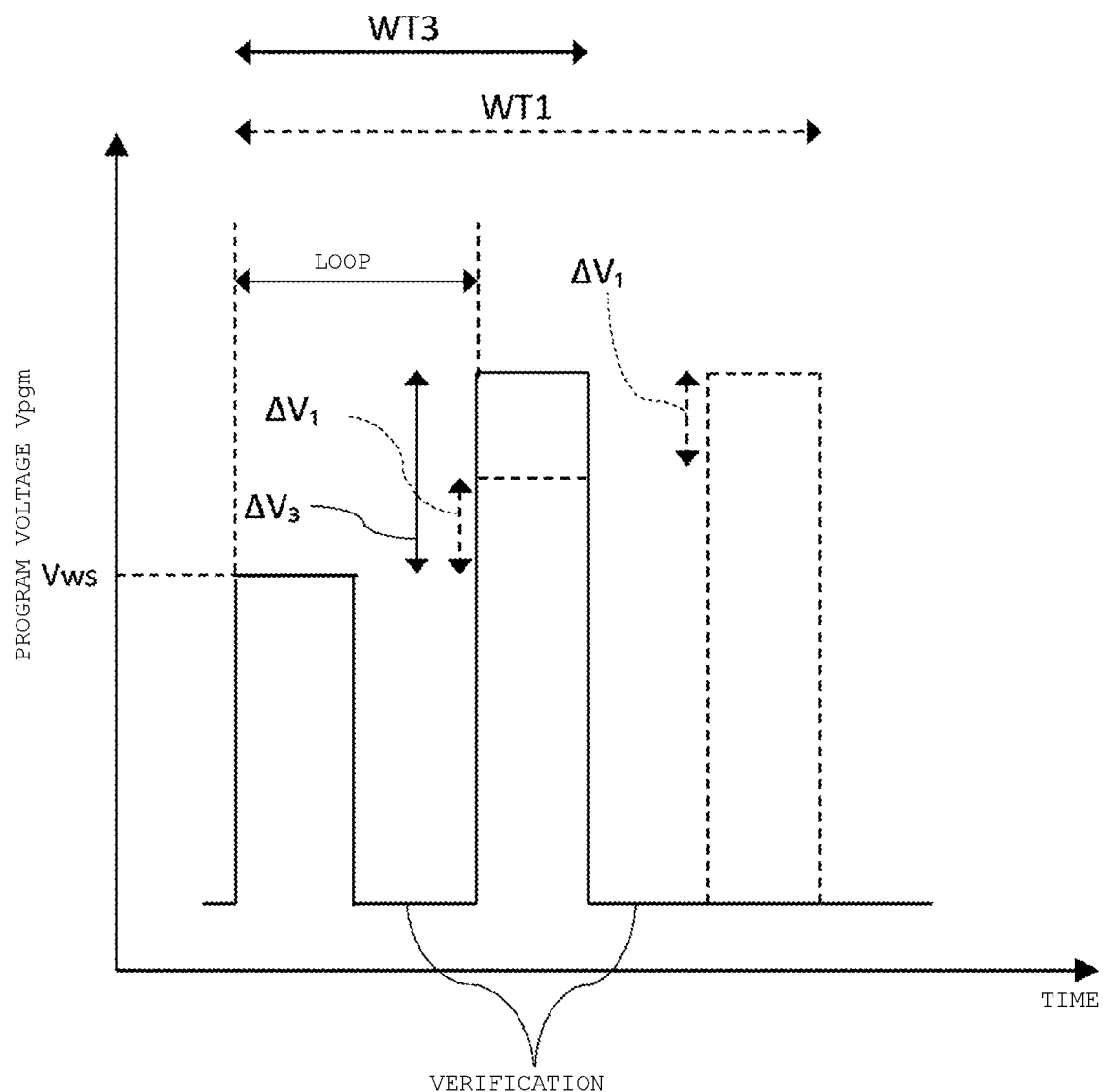
FIG. 22 is a diagram illustrating write processes according to the fourteenth and eighteenth embodiments.

FIG. 22 is a diagram illustrating a write process in the normal mode and the performance priority mode. As illustrated in FIG. 22, in the write process, after a write operation is performed with a program start voltage Vws and a verification operation is performed, the write operation and the verification operation are repeated while increasing the program voltage by a constant increase size $\Delta V$ until it is determined that writing is successful. In a case of FIG. 22, in the normal mode, the writing is completed when the program voltage increase size $\Delta V=\Delta V1$ and the number of loops is 3, and the write time becomes WT1. In the performance priority mode, the writing is completed when the program voltage increase size $\Delta V=\Delta V3$ ($>\Delta V1$) and the number of loops is 2, and the writing time becomes WT3 ($<$WT1).

By making the increase size of the program voltage in the performance priority mode larger than the increase size of the program voltage in the normal mode, the number of loops can be reduced during the write operation in the performance priority mode. It is possible to reduce the time to complete the write operation and to improve performance of the memory system.

Fifteenth Embodiment

A parameter to be modified to improve the performance of the memory system in the performance priority mode may be a magnitude of a program start voltage. The write process includes a plurality of write operations, and a voltage for performing a first write operation among the plurality of write operations in the write process is referred to as a write start voltage. By increasing the program start voltage, time for the memory cell to reach a target threshold voltage can be reduced. That is, time to complete the write operation can be reduced. FIG. 20B is a diagram illustrating magnitudes of the program start voltage as parameters to be set in the normal mode and the performance priority mode. As illustrated in FIG. 20B, the memory controller 10 controls an access operation to the memory cell such that the first write operation among the plurality of write operations is performed with a voltage Vws1 in the normal mode. The memory controller 10 controls the access operation to the memory cell such that the first write operation is performed with a voltage Vws3 ($>$Vws1) in the performance priority mode.

Figure 23:
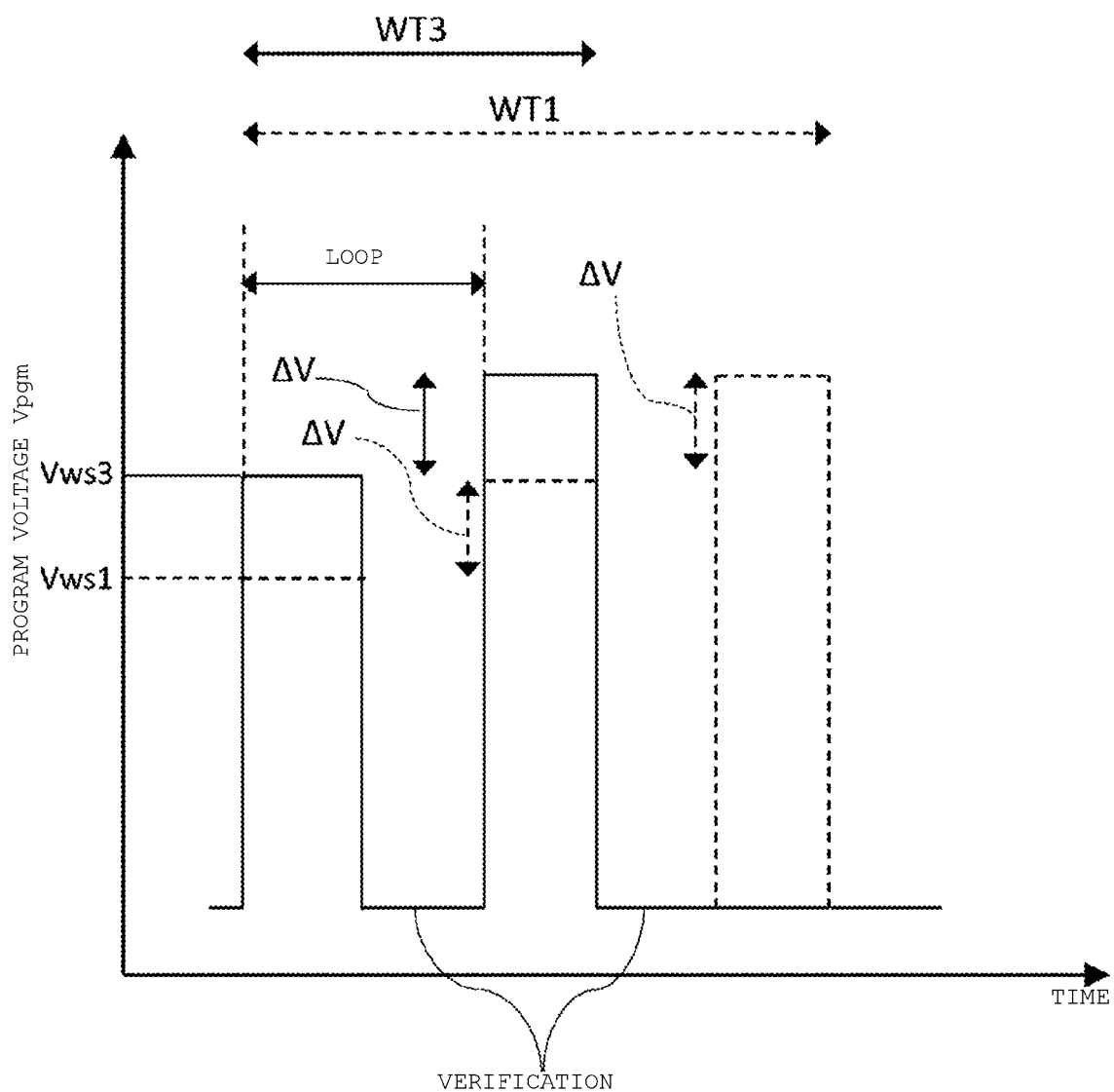
FIG. 23 is a diagram illustrating a write process according to the fifteenth embodiment.

FIG. 23 is a diagram illustrating the write process in the normal mode and the performance priority mode. As illustrated in FIG. 23, in the write process, after a write operation is performed with the program start voltage Vws and a verification operation is performed, the write operation and the verification operation are repeated while increasing a program voltage by a constant increase size ΔV until it is determined that writing is successful. In a case of FIG. 23, in the normal mode, the write operation is performed with the program start voltage Vws1, and then the writing is completed when the number of loops is 3 at the increase size ΔV of the program voltage, and the write time becomes WT1. In the performance priority mode, the write operation is performed with the program start voltage Vws3 (>Vws1), and then the writing is completed when the number of loops is 2 at the increase size ΔV of the program voltage, and the write time becomes WT3 (<WT1).

By making the program start voltage in the performance priority mode higher than the program start voltage in the normal mode, the number of loops can be reduced during the write process in the performance priority mode. It is possible to reduce time to complete the write process and to improve performance of the memory system.

Sixteenth Embodiment

A parameter to be modified to improve the performance of the memory system in performance priority mode may be a magnitude of an erasing start voltage. An erasing process includes a plurality of erasing operations, and a voltage for performing a first erasing operation among a plurality of erasing operations in the erasing process is referred to as an erasing start voltage. By increasing the erasing start voltage, time for the memory cell to reach a target threshold voltage can be reduced. That is, time to complete the erasing process can be reduced. FIG. 20C is a diagram illustrating the magnitude of the erasing start voltage as parameters to be set in the normal mode and the performance priority mode. As illustrated in FIG. 20C, the memory controller 10 controls an access operation to the memory cell such that the first erasing operation of the plurality of erasing operations is performed with a voltage Vers1 in the normal mode. The memory controller 10 controls the access operation to the memory cell such that the first erasing operation is performed with a voltage Vers3 (>Vers1) in the performance priority mode.

Figure 24:
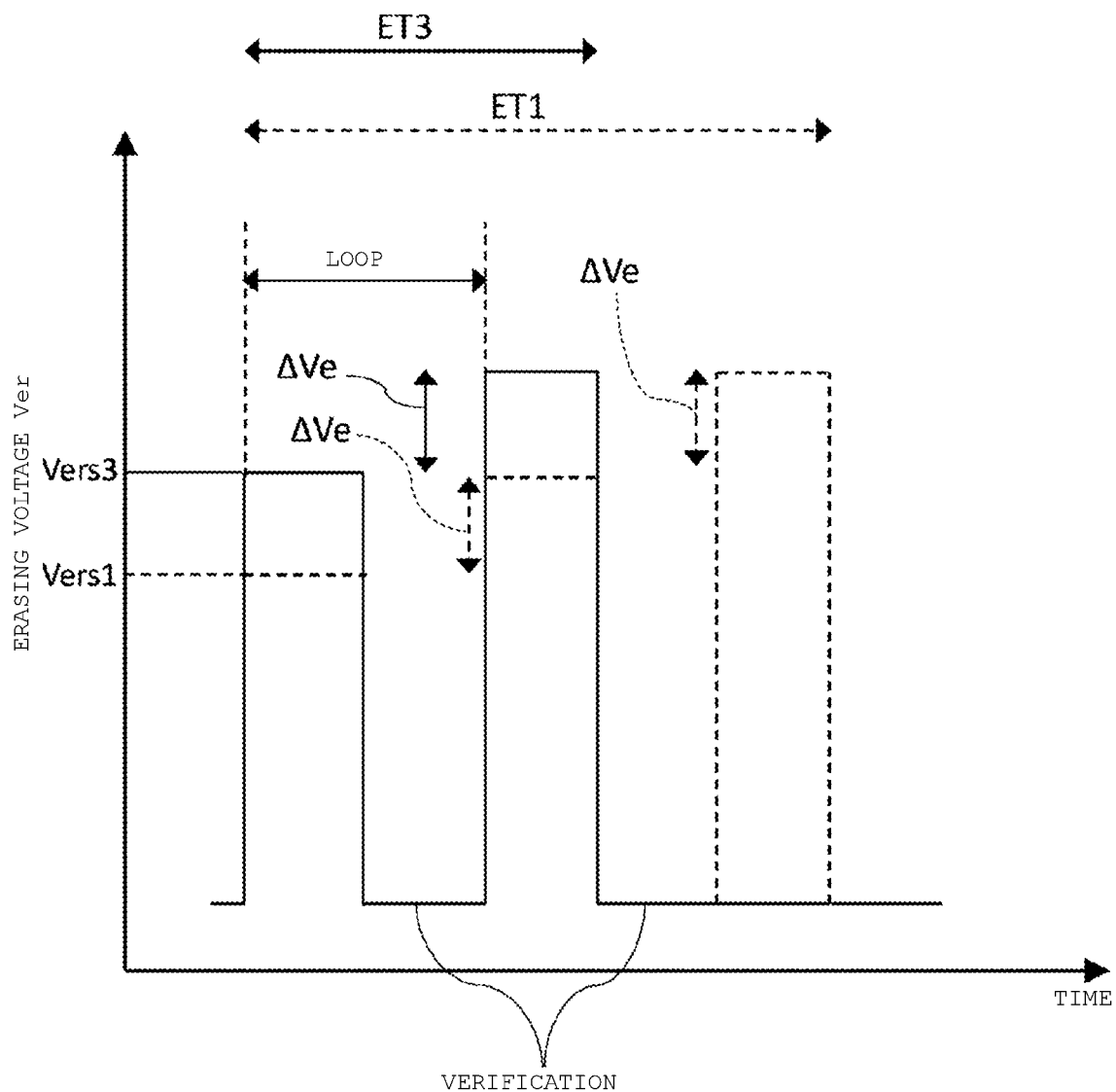
FIG. 24 is a diagram illustrating erasing processes according to the sixteenth and nineteenth embodiments.

FIG. 24 is a diagram illustrating the erasing process in the normal mode and the performance priority mode. As illustrated in FIG. 24, in the erasing process, after the erasing operation is performed with an erasing start voltage Vers and the verification operation is performed, the erasing operation and the verification operation are repeated while increasing the erasing voltage by a constant increase size ΔVe until it is determined that erasing is successful. In the normal mode, the erasing operation is performed with the erasing start voltage Vers1, and then the erasing is completed when the number of loops is 3 at the erasing voltage increase size ΔVe, and erasing time becomes ET1. In the performance priority mode, the erasing operation is performed with the erasing start voltage Vers3 (>Vers1), and then the erasing is completed when the number of loops is 2 at the erasing voltage increase size ΔVe, and the erasing time becomes ET3 (<ET1).

By making the erasing start voltage in the performance priority mode higher than the erasing start voltage in the normal mode, the number of loops can be reduced during the erasing process in the performance priority mode. It is possible to reduce time to complete the erasing process and to improve the performance of the memory system.

Seventeenth Embodiment

A parameter to be modified to improve the performance of the memory system in the performance priority mode may be a verification voltage during the erasing process. FIG. 21A is a diagram illustrating the magnitude of the verification voltage during the erasing process as parameters to be set in the normal mode and the performance priority mode. As illustrated in FIG. 21A, the memory controller 10 controls an access operation to the memory cell such that a verification operation during the erasing process is performed with a voltage Vfer0, in the normal mode. The memory controller 10 controls the access operation to the memory cell such that the verification operation during the erasing process is performed with a voltage Vfer4 (>Vfer0) in the performance priority mode. That is, in the performance priority mode, the memory controller 10 performs a shallower erasing operation than the erasing operation in the normal mode. By doing so, time taken until the memory cells are determined to be in the "Er" state is reduced, and time to complete the erasing process is reduced.

By making the verification voltage in the performance priority mode higher than the verification voltage in the normal mode, the number of loops can be reduced during the erasing process in the performance priority mode. It is possible to reduce time to complete the erasing process and to improve the performance of the memory system.

Eighteenth Embodiment

A parameter to be modified to improve the performance of the memory system in the performance priority mode may increase the number of memory cells allowed during verification of the write process among the memory cells in which data to be written is not written. A memory cell to which data to be written is not written is referred to as an error bit. By increasing the number of error bits allowed during verification, the number of loops can be reduced and time to complete the write process can be reduced. FIG. 21B is a diagram illustrating the number of error bits allowed during verification in the write process as parameters to be set in the normal mode and the performance priority mode. As illustrated in FIG. 22, in the write process, after the write operation is performed with the program start voltage Vws and the verification operation is performed, the write operation and the verification operation are repeated while increasing the program voltage by a constant increase size ΔV until it is determined that writing is successful. The sequencer 211 reads the written data, compares the data with data to be written, and detects an error bit to determine whether or not writing is successful. When the number of error bits is greater than a constant value n, the sequencer 211 performs a write operation for data again, and when the number of error bits is less than or equal to the certain value n, the sequencer 211 determines that the writing is successful. In the normal mode, the sequencer 211 determines that the writing is successful when the number of error bits is equal to or less than n1, and the writing is completed when the number of loops is 3, and write time becomes WT1. In the performance priority mode, the sequencer 211 determines that the writing is successful when the number of error bits is less than or equal to n3 (>n1), the writing is completed when the number of loops is 2, and the writing time becomes WT3 (<WT1).

By increasing the number of error bits allowed during verification of the write process in the performance priority mode to be greater than the number of error bits in the normal mode, the number of loops can be reduced during the write process in the performance priority mode. It is possible to reduce time to complete the write process and to improve performance of the memory system.

Nineteenth Embodiment

A parameter to be modified to improve performance of the memory system in the performance priority mode may be the number of memory cells that are allowed to be in a non-erased state during verification of the erasing process. By increasing the number of memory cells that are allowed to be not in the erasing state during verification, the number of loops can be reduced and time to complete the erasing process can be reduced. FIG. 21C is a diagram illustrating the numbers of memory cells allowed to be in a non-erased state during verification of the erasing process as parameters to be set in the normal mode and the performance priority mode. As illustrated in FIG. 24, in the erasing process, after the erasing operation is performed with an erasing start voltage Vers and the verification operation is performed, the erasing operation and the verification operation are repeated while increasing the erasing voltage by a constant increase size ΔVe until it is determined that erasing is successful. The sequencer 211 senses the memory cells in the block in which the erasing operation is performed, and detects the number of memory cells in the non-erased state to determine whether or not erasing is successful. When the number of memory cells in the non-erased state is greater than a constant value m, the sequencer 211 performs a data erasing operation again, and when the number of memory cells in the non-erased state is less than or equal to the constant value m, the sequencer determines that the data erasing is successful. In the normal mode, the sequencer 211 determines that the writing is successful when the number of memory cells in the non-erased state is less than or equal to m1, the erasing is completed when the number of loops is 3, and erasing time becomes ET1. In the performance priority mode, the sequencer 211 determines that the erasing process is successful when the number of memory cells in the non-erased state is less than or equal to m3 (>m1), the erasing is completed when the number of loops is 2, and the erasing time becomes ET3 (<ET1).

By increasing number of memory cells allowed to be in the non-erased state during verification of the erasing process in the performance priority mode to be greater than such a number in the normal mode, the number of loops can be reduced during the erasing process in the performance priority mode. It is possible to reduce time to complete the erasing process and to improve the performance of the memory system.

Modification Examples

A modification examples of the twelfth to nineteenth embodiments will be described.

In the performance priority mode, when performing a write operation with a program start voltage or a program voltage having a larger increase size than in the normal mode, or when performing an erasing operation with an erasing start voltage or an erasing voltage having a larger increase size than in the normal mode, the memory cell can be worn out more than in the normal mode. Therefore, the number of allowable write/erasing of the memory cells may be reduced.

When a temperature crossover indicating a difference between a temperature during a write process and a temperature during a read process is increased, a bit error rate can be increased. The memory cell may be more easily worn out also in the performance priority mode than in the normal mode, and thus, it is desirable to reduce influence of temperature crossover. Therefore, a difference between a temperature during the write process and a temperature during the read process may be reduced by narrowing a range between a writable temperature and a readable temperature in the performance priority mode more than in the normal mode.

Since the write/read parameters are different in the normal mode and the performance priority mode, a write parameter and a read parameter may be prepared for each mode. At this time, parameters may be used separately for each storage unit by using mode management information illustrated in FIG. 6. In a logical block used in the normal mode, data is written in a write style according to the write parameters for the normal mode, and data is read by using a read style according to the read parameters for the normal mode. In a logical block used in the performance priority mode, data is written in a write style according to the write parameter for the performance priority mode, and data is read in a read style according to the read parameter for the performance priority mode.

For example, in the performance priority mode, a read voltage during the read process or a search center voltage (and a search width) of Vth tracking (tracking read) may also be a value shifted according to the write parameter. When the threshold voltage distribution is shifted during the write process in the performance priority mode, the read voltage during the read process and the search center voltage (and the search width) of the Vth tracking may be shifted accordingly thereto.

A change in parameter and the like described in the twelfth to nineteenth embodiments may be combined in any manner.

Twentieth Embodiment

Figure 25:
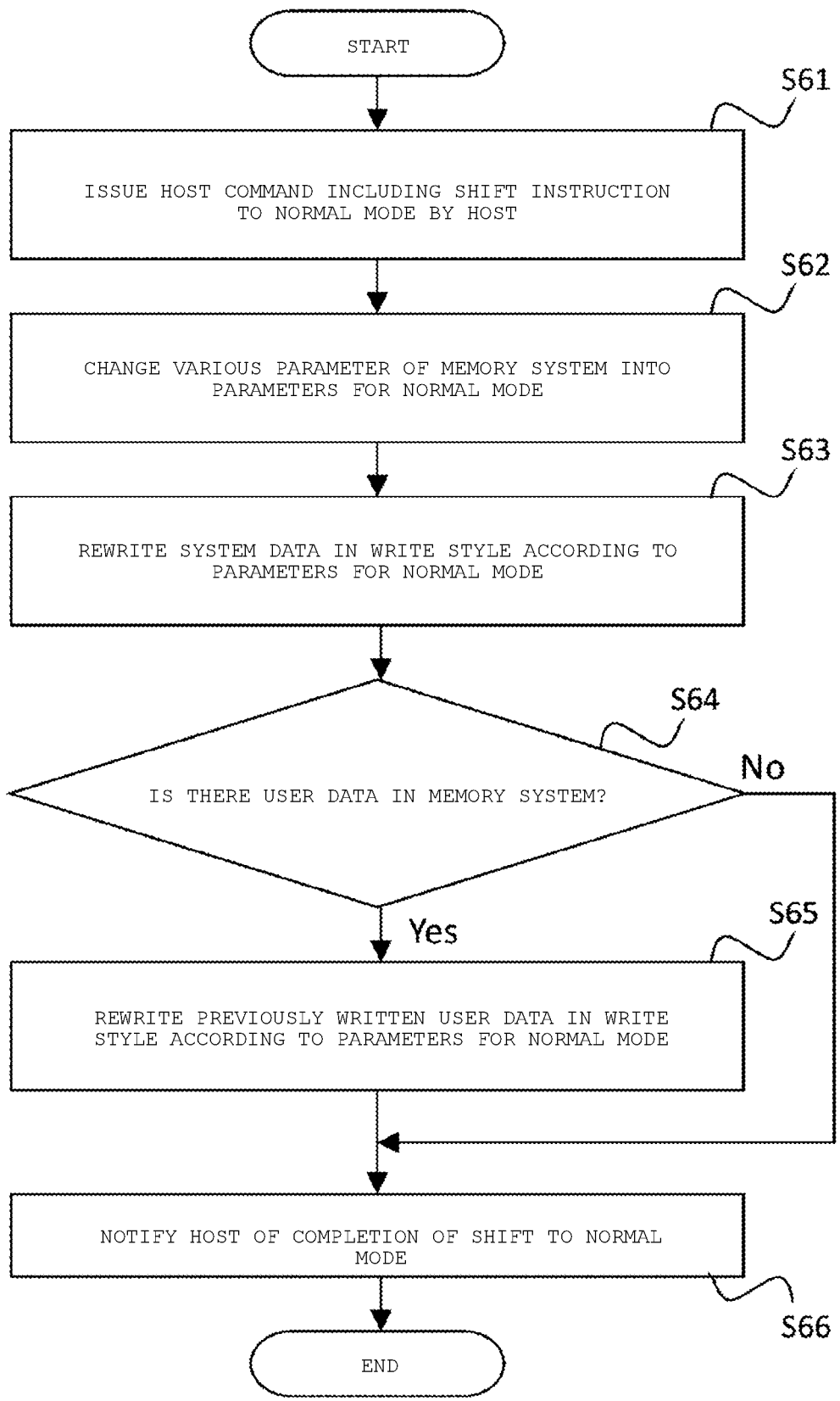
FIG. 25 is a flowchart illustrating a shift operation from a performance priority mode to a normal mode of a memory system according to a twentieth embodiment.

A return from the performance priority mode to the normal mode may be performed by a method illustrated in FIG. 25. FIG. 25 is a flowchart illustrating an operation of returning from the performance priority mode to the normal mode of the memory system according to a 21st embodiment.

In the performance priority mode, the memory controller 10 controls an access operation to each memory cell of the non-volatile memory 20 with a parameter of the performance priority mode. When the host 30 receives a user request to operate the memory system in the normal mode, or when the host 30 autonomously determines that the memory system should operate in the normal mode, a host command CM5 including a shift instruction to the normal mode is issued from the host 30 (S61). When the host command CM5 is received by the host I/F 15, the memory controller 10 changes a parameter in the memory system 1 into a parameter for the normal mode according to the host command CM5 (S62). The memory controller 10 rewrites system data in a write style according to the parameter for the normal mode (S63). That is, the memory controller 10 reads the system data from a management information storage area (not illustrated) of the non-volatile memory 20.

The memory controller 10 writes back the read system data to a management information storage area in a write style according to the parameter for the normal mode. The memory controller 10 determines whether or not user data exists in the memory system 1 (S64). When the user data does not exist in the memory system 1 (NO in S64), the memory controller 10 returns a notification of completion of a shift to the normal mode to the host 30 (S66).

When the user data exists in the memory system 1 (YES in S64), the memory controller 10 rewrites the previously written user data in a write style according to the parameter for the normal mode (S65). Then, the memory controller 10 returns a notification of the completion of the shift to the host 30 (S66). An operation of FIG. 25 may be repeated until the return to the normal mode is completed.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a non-volatile memory including memory cells; and
a controller configured to switch a mode for controlling an access operation to the non-volatile memory from a first mode to a second mode, in response to receiving from a host, a first command for instructing the controller to switch the mode from the first mode to the second mode,
wherein the access operation controlled according to the second mode improves data retention relative to the access operation controlled according to the first mode.

2. The memory system according to claim 1,
wherein the controller is configured to switch the mode from the second mode to the first mode, in response to receiving from the host, a second command for instructing the controller to return to the first mode from the second mode.

3. The memory system according to claim 1,
wherein the controller is configured to switch the mode from the second mode to the first mode, based on a determination made by the controller.

4. The memory system according to claim 1, wherein
the access operation is a write operation,
the control of the write operation according to the first mode includes setting a size of increase in a program voltage during a programming loop executed in the non-volatile memory, to a first voltage increase size, and
the control of the write operation according to the second mode includes setting the size of increase in the program voltage during the programming loop executed in the non-volatile memory, to a second voltage increase size that is smaller than the first voltage increase size.

5. The memory system according to claim 1, wherein
the access operation is a write operation,
the control of the write operation according to the first mode includes setting a read pass voltage to be applied to non-selected word lines during a write verification operation to a first voltage, and
the control of the write operation according to the second mode includes setting the read pass voltage to be applied to the non-selected word lines during the write verification operation to a second voltage that is higher than the first voltage.

6. The memory system according to claim 1, wherein
the access operation is a write operation,
the control of the write operation according to the first mode includes controlling the non-volatile memory to store a first number of bits per memory cell, and
the control of the write operation according to the second mode includes controlling the non-volatile memory to store a second number of bits that is smaller than the first number of bits.

7. The memory system according to claim 1,
wherein a user capacity of the non-volatile memory when the non-volatile memory is controlled according to the second mode is smaller than a user capacity of the non-volatile memory when the non-volatile memory is controlled according to the first mode.

8. The memory system according to claim 1, wherein
the access operation is a read operation from the non-volatile memory,
the control of the read operation according to the first mode includes performing an error correction coding process on data read from the non-volatile memory at a first code rate, and
the control of the read operation according to the second mode includes performing the error correction coding process on the data read from the non-volatile memory at a second code rate that is smaller that is lower than the first code rate.

9. The memory system according to claim 1, wherein
the non-volatile memory further includes a plurality of word lines, and the access operation is a write operation,
the control of the write operation according to the first mode includes controlling the non-volatile memory to write data to the plurality of memory cells using adjacent word lines among the plurality of word lines, and
the control of the write operation according to the second mode includes controlling the non-volatile memory to write data to the plurality of memory cells using every N word lines among the plurality of word lines, where N is 2 or more, and not write data to the plurality of memory cells connected to the other word lines.

10. A memory system comprising:
a non-volatile memory including at least one memory cell; and
a controller configured to switch a mode for controlling an access operation to the non-volatile memory from a first mode to a second mode, in response to receiving from a host, a first command for instructing the controller to switch the mode from the first mode to the second mode,
wherein the access operation controlled according to the second mode degrades data retention relative to the access operation controlled according to the first mode, and the access operation controlled according to the second mode improves speed of writing or erasing.

11. The memory system according to claim 10, wherein
the access operation is a write operation,
the control of the write operation according to the first mode includes setting a size of increase in a program voltage during a programming loop executed in the non-volatile memory, to a first voltage increase size, and the control of the write operation according to the second mode setting the size of increase in the program voltage during the programming loop executed in the non-volatile memory, to a second voltage increase size that is greater than the first voltage increase size.

12. The memory system according to claim 10, wherein
the access operation is a write operation that includes a plurality of programming loops,
the control of the write operation according to the first mode includes setting an initial voltage for the plurality of programming loops to a first voltage, and
the control of the write operation according to the second mode includes setting an initial voltage for the plurality of programming loops to a second voltage that is higher than the first voltage.

13. The memory system according to claim 10, wherein
the access operation is an erasing operation that is includes a plurality of programming loops,
the control of the erasing operation according to the first mode includes setting an initial voltage for the plurality of programming loops to a first voltage, and
the control of the erasing operation according to the second mode includes setting an initial voltage for the plurality of programming loops to a second voltage that is higher than the first voltage.

14. The memory system according to claim 10,
the access operation is an erasing operation,
the control of the erasing operation according to the first mode includes setting a first verification voltage to be applied during an erase verification operation, and
the control of the erasing operation according to the second mode includes setting a second verification voltage that is higher than the first verification voltage to be applied during the erase verification operation.

15. The memory system according to claim 10, wherein
the at least one memory cell includes a plurality of memory cells, and the access operation is a write operation, the control of the write operation according to the first mode includes setting the number of error bits that are allowed to be a first number, and
the control of the write operation according to the second mode includes setting the number of error bits to be a second number that is greater than the first number.

16. The memory system according to claim 10, wherein
the at least one memory cell includes a plurality of memory cells, and the access operation is an erasing operation,
the control of the erasing operation according to the first mode includes setting the number of memory cells that are allowed to be non-erased memory cells to be a first number, and
the control of the erasing operation according to the second mode includes setting the number of memory cells that are allowed to be non-erased memory cells to be a second number that is greater than the first number.

17. The memory system according to claim 10,
wherein the controller is configured to switch the mode from the second mode to the first mode in response to receiving from the host, a second command for instructing the controller to return to the first mode from the second mode.

18. The memory system according to claim 10,
wherein the controller is configured to switch the mode from the second mode to the first mode, based on a determination made by the controller.

19. A memory system comprising:
a non-volatile memory including memory cells; and
a controller configured to switch a mode for controlling an access operation to the non-volatile memory from a first mode to a second mode, in response to receiving from a host, a first command to change parameters of the access operation to the non-volatile memory,
wherein the access operation controlled according to the second mode improves data retention and has lower performance, relative to the access operation controlled according to the first mode.

20. The memory system according to claim 19, wherein the access operation is a write operation or an erasing operation.

* * * * *